(12) United States Patent
Watanabe et al.

(10) Patent No.: US 7,772,771 B2
(45) Date of Patent: Aug. 10, 2010

(54) ALKALI METAL GENERATING AGENT, ALKALI METAL GENERATOR, PHOTOELECTRIC SURFACE, SECONDARY ELECTRON EMISSION SURFACE, ELECTRON TUBE, METHOD FOR MANUFACTURING PHOTOELECTRIC SURFACE, METHOD FOR MANUFACTURING SECONDARY ELECTRON EMISSION SURFACE, AND METHOD FOR MANUFACTURING ELECTRON TUBE

(75) Inventors: Takashi Watanabe, Hamamatsu (JP); Yoshiro Akai, Hamamatsu (JP); Shirou Sakai, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 718 days.

(21) Appl. No.: 10/537,587

(22) PCT Filed: Jan. 16, 2004

(86) PCT No.: PCT/JP2004/000304

§ 371 (c)(1),
(2), (4) Date: Jun. 6, 2005

(87) PCT Pub. No.: WO2004/066339

PCT Pub. Date: Aug. 5, 2004

(65) Prior Publication Data
US 2006/0049755 A1    Mar. 9, 2006

(30) Foreign Application Priority Data
Jan. 17, 2003 (JP) .............................. 2003-009927

(51) Int. Cl.
*H01J 31/26* (2006.01)
*H01J 1/14* (2006.01)
*H01J 17/26* (2006.01)

(52) U.S. Cl. .................. 313/542; 313/446; 313/532; 445/28

(58) Field of Classification Search .......... 313/542–544, 313/103 R, 105 CM, 532–533
See application file for complete search history.

(56) References Cited

U.S. PATENT DOCUMENTS 2,117,735 A    5/1938    Lester (Continued)

FOREIGN PATENT DOCUMENTS

GB    520025    4/1940

(Continued)

OTHER PUBLICATIONS

Hideki Suzuki, JP 55078438, Japanes Patent Office, Dec. 1978 (USPTO, Human Translation).*

(Continued)

*Primary Examiner*—Sikha Roy
*Assistant Examiner*—Tracie Green
(74) *Attorney, Agent, or Firm*—Drinker Biddle & Reath LLP

(57) ABSTRACT

The present invention relates to an alkali metal generating agent and others for formation of a photo-cathode or a secondary-electron emitting surface capable of stably generating an alkali metal. The alkali metal generating agent is used in formation of a photo-cathode for emitting a photoelectron corresponding to incident light, or in formation of a secondary-electron emitting surface for emitting secondary electrons corresponding to an incident electron. Particularly, the alkali metal generating agent contains at least an oxidizer comprising at least one vanadate with an alkali metal ion as a counter cation, and a reducer for reducing the ion. An alkali metal generating device comprises at least the alkali metal generating agent and a case housing it, and the case is provided with a discharge port for discharging the vapor of the alkali metal.

22 Claims, 13 Drawing Sheets

U.S. PATENT DOCUMENTS

| | | | | |
|---|---|---|---|---|
| 3,387,161 | A * | 6/1968 | Van Laar et al. | 313/542 |
| 3,658,713 | A * | 4/1972 | Yorikatsu et al. | 252/181.4 |
| 3,761,614 | A * | 9/1973 | Bradley | 356/226 |
| 4,459,508 | A * | 7/1984 | Ichikawa et al. | 313/529 |
| 4,774,433 | A | 9/1988 | Ikebe et al. | |
| 4,855,930 | A * | 8/1989 | Chao et al. | 702/32 |
| 5,066,888 | A * | 11/1991 | Van Der Marel et al. | 313/564 |
| 5,925,976 | A * | 7/1999 | Hayashida et al. | 313/346 R |
| 5,982,094 | A * | 11/1999 | Niigaki et al. | 313/542 |
| 6,198,221 | B1 * | 3/2001 | Suyama et al. | 313/542 |
| 6,320,181 | B1 * | 11/2001 | Noji et al. | 250/214 VT |
| RE38,234 | E * | 8/2003 | Warashina et al. | 250/372 |
| 6,753,648 | B2 | 6/2004 | Boffito et al. | 313/564 |

FOREIGN PATENT DOCUMENTS

| | | |
|---|---|---|
| GB | 715284 | 9/1954 |
| GB | 1 203 547 | 8/1970 |
| GB | 1 237 673 | 6/1971 |
| JP | 45-7566 | 3/1970 |
| JP | 47-15976 | 5/1972 |
| JP | 47-21951 | 6/1972 |
| JP | 47-25541 | 7/1972 |
| JP | 47-35221 | 10/1972 |
| JP | 48-20944 | 6/1973 |
| JP | 53-124059 | 10/1978 |
| JP | 55-78438 | 6/1980 |
| JP | 10-040864 | 2/1998 |
| WO | WO 02/093664 | 11/2002 |

OTHER PUBLICATIONS

Tsumoto et al., JP 06-231727, Japanenese Patent Office, Aug. 1994, (Machine translation).*

* cited by examiner

Fig.14

|  | Sk (μA/lm) | Sp (A/lm) | Idb (nA) | After Pulse (%) |
|---|---|---|---|---|
| SAMPLES | 36.2 | 368.2 | 0.1 | 1.8 |
| COMPARATIVE EXAMPLE | 45.9 | 459 | 1.1 | 2.3 |

Fig.15

|  | Life (%) | | | |
|---|---|---|---|---|
|  | AFTER 24h | AFTER 96h | AFTER 240h | AFTER 500h |
| SAMPLES | 96.0 | 90.3 | 82.0 | 75.5 |
| COMPARATIVE EXAMPLE | 95.2 | 91.0 | 82.7 | 74.4 |

ALKALI METAL GENERATING AGENT, ALKALI METAL GENERATOR, PHOTOELECTRIC SURFACE, SECONDARY ELECTRON EMISSION SURFACE, ELECTRON TUBE, METHOD FOR MANUFACTURING PHOTOELECTRIC SURFACE, METHOD FOR MANUFACTURING SECONDARY ELECTRON EMISSION SURFACE, AND METHOD FOR MANUFACTURING ELECTRON TUBE

TECHNICAL FIELD

The present invention relates to an alkali metal generating agent, an alkali metal generating device, a photo-cathode, a secondary-electron emitting surface, an electron tube, a method of production of the photo-cathode, a method of production of the secondary-electron emitting surface, and a method of production of the electron tube.

BACKGROUND ART

The known photo-cathodes for emitting an electron (photoelectron or primary electron) corresponding to an incident photon include so-called transmission type photo-cathodes formed on a transparent substrate, and so-called reflection type photo-cathodes formed on a metal substrate such as Ni, and such photo-cathodes are adopted as important components, for example, in electron tubes such as photomultiplier tubes, photo-tubes, image intensifiers, streak tubes, and so on.

Many of the photo-cathodes now in practical use are made from a photoelectron emitting material containing an alkali metal (primarily, an intermetallic compound or a compound semiconductor), e.g., an intermetallic compound of Sb and Cs.

Conventionally, the photoelectron emitting material containing the above alkali metal as a constituent element is formed by generating the vapor of the alkali metal in an ambience held at a predetermined vacuum (preferably, $10^{-7}$-$10^{-2}$ Pa in terms of partial pressure of residual gas) and temperature and reacting the alkali metal vapor with a constituent material of the photoelectron emitting material that is to react with the alkali metal. In an example of forming the photoelectron emitting material of the intermetallic compound of Sb and Cs, for example, a deposited film of Sb, which is a constituent material of the photoelectron emitting material to react with the alkali metal, is first formed on a substrate, and the vapor of Cs is then generated to react Cs with the deposited film of Sb, thereby forming a layer of the intermetallic compound.

In this case, the alkali metal is extremely instable in the atmosphere and therefore the alkali metal itself cannot be used as a source of the vapor of the alkali metal. It is thus common practice to use a supply source (so called an alkali source or alkali metal source) containing as a constituent a combination of an oxidizer with a reducer capable of generating the alkali metal by oxidation-reduction (redox) reaction at predetermined temperature. Examples of this supply source used heretofore include powder alkali metal sources, and alkali metal sources pressure-formed (pressed) in a pellet form. In the present specification, the alkali metal source (supply source) for the alkali metal vapor containing the aforementioned oxidizer and reducer will be referred to as an alkali metal generating agent.

These powder alkali metal generating agents or pelletized alkali metal generating agents are normally used in a state in which the generating agent is housed in a metal case provided with an aperture enough to discharge the alkali metal vapor to the outside. Furthermore, this metal case is also used as enclosed in a glass ampule in certain cases. Then this metal case is heated in formation of the photo-cathode to generate the alkali metal vapor.

Furthermore, the alkali metal generating agent is also used, for example, in formation of the secondary-electron emitting surface of dynodes in photomultiplier tubes.

An example of such alkali metal generating agents used conventionally is a powdered or pelletized alkali metal generating agent containing Si, Ti, Al, or the like as a reducer and containing as an oxidizer a chromate with an alkali metal ion as a counter cation (e.g., $Cs_2CrO_4$ or the like). The alkali metal generating agent containing this oxidizer is disclosed, for example, in Japanese Patent Applications Laid-Open No. 55-78438 and Laid-Open No. 53-124059.

DISCLOSURE OF THE INVENTION

The Inventors investigated the above conventional technology and found the problems as described below. In a case where the photo-cathode to be applied to the aforementioned electron tube is produced using the alkali metal generating agent containing as an oxidizer the chromate with an alkali metal ion as a counter cation, the redox reaction between the oxidizer of the above chromate and the reducer has very large reaction rates and, as the temperature of the reaction field gradually increases, the reaction suddenly proceeds at a predetermined temperature enough for progress of reaction. Therefore, there was a problem in production that it was extremely difficult to control the reaction rates by control of reaction temperature once the reaction started.

More specifically, since the temperature of the reaction field quickly increases with the sudden progress of the redox reaction, there was a possibility of rupture of the alkali metal generating agent itself, or the metal case or glass ampule housing the alkali metal generating agent. If this situation occurs during production of the photo-cathode in the electron tube, it will be difficult to control the amount of the alkali metal and desired performance will not be achieved. In this case, the used metal case is left in a housing of the electron tube such as a glass container, from constraints on production efficiency or the like, and the rupture of the metal case can result in a defective product in appearance.

Furthermore, generating rates and yields of the alkali metal largely vary because of the sudden progress of the redox reaction, which posed a problem that states of deposition of the alkali metal were nonuniform in an area where the photo-cathode should be formed or in an area where the secondary-electron emitting surface of the dynode should be formed. For example, in a case where the alkali metal generating agent is heated by a high-frequency heating method, the redox reaction suddenly proceeds with use of the conventional chromate, so that the timing of a stop of heating cannot be always constant. Therefore, there can occur variation in spectral response characteristics (radiant sensitivity and quantum efficiency) among a plurality of photo-cathodes produced under similar conditions, and, as to a plurality of dynodes produced under similar conditions, there can also occur variation in multiplication efficiency among them, so as to result in producing defective products, thereby reducing production efficiency.

The present invention has been accomplished in order to solve the problems as described above, and an object of the present invention is to provide an alkali metal generating agent for formation of a photo-cathode or secondary-electron emitting surface capable of stably generating an alkali metal, an alkali metal generating device comprising the alkali metal generating agent and enabling easy control of generating rates of the alkali metal, a photo-cathode with satisfactory spectral response characteristics, a secondary-electron emitting surface with satisfactory multiplication efficiency, and an electron tube with satisfactory photoelectric conversion characteristics. Another object of the present invention is to provide a method of production of the photo-cathode, a method of production of the secondary-electron emitting surface, and a method of production of the electron tube easy in formation and excellent in reproducibility of performance.

The Inventors conducted elaborate research in order to achieve the above objects and found out that one of significant reasons why the reaction rates of the redox reaction between the aforementioned conventional oxidizer and reducer were high was not the reducer but rather that the oxidizer of the chromate with an alkali metal ion as a counter cation had a very strong oxidizing power.

Then the Inventors checked oxidizers with oxidizing power weaker than that of the aforementioned chromate and found that, by using a vanadate as the oxidizer, it was feasible to produce a photo-cathode and a secondary-electron emitting surface with performance comparable to those produced using the aforementioned conventional chromate, without difficulty and with good reproducibility.

Namely, an aspect of the present invention is an alkali metal generating agent serving as a supply source of an alkali metal used in formation of a photo-cathode for emitting a photoelectron corresponding to incident light or in formation of secondary-electron emitting surface for emitting secondary electrons corresponding to an incident electron, the alkali metal generating agent comprising at least an oxidizer and a reducer. Particularly, in the alkali metal generating agent, the oxidizer comprises at least one vanadate with an alkali metal ion as a counter cation. The reducer initiates a redox reaction with the oxidizer at a predetermined temperature to reduce the alkali metal ion.

Since the vanadate with the alkali metal ion as a counter cation has an oxidizing power weaker than the aforementioned chromate, the redox reaction with the reducer proceeds moderately as compared with the case of the oxidizer being the chromate. For this reason, it is easy to control the reaction rates by adjustment of reaction temperature even after the reaction starts once. In other words, the alkali metal (the alkali metal vapor) can be generated on a stable basis, without rupturing the alkali metal generating agent itself according to the present invention or without rupturing a case housing it.

Accordingly, by using the alkali metal generating agent comprising this vanadate, it is feasible to produce the photo-cathode with satisfactory spectral response characteristics or the secondary-electron emitting surface with satisfactory multiplication efficiency, without any difficulty and with good reproducibility.

An alkali metal generating device according to the present invention generates an alkali metal used in formation of a photo-cathode for emitting a photoelectron corresponding to incident light or in formation of a secondary-electron emitting surface for emitting secondary electrons corresponding to an incident electron. The alkali metal generating device comprises a case, a supply source, and a discharge port. Particularly, in the alkali metal generating device, the case is preferably a metal case for housing the supply source. The supply source is an alkali metal generating agent of the aforementioned structure (the alkali metal generating agent according to the present invention), which comprises a raw material to generate the alkali metal. The discharge port is provided in the case so as to discharge a vapor of the alkali metal generated in the supply source, from an interior space of the case housing the supply source, toward the outside of the case.

With the alkali metal generating device of the present invention internally housing the alkali metal generating agent of the aforementioned structure, it is feasible to stably discharge the alkali metal (the alkali metal vapor) generated by the redox reaction between the oxidizer and the reducer in the alkali metal generating agent, from the discharge port of the case to the outside.

Accordingly, by using the alkali metal generating device according to the present invention, it is feasible to produce the photo-cathode with satisfactory spectral response characteristics or the secondary-electron emitting surface with satisfactory multiplication efficiency, without any difficulty and with good reproducibility.

A photo-cathode according to the present invention comprises an alkali metal which emits a photoelectron corresponding to incident light. This alkali metal is the alkali metal generated from the alkali metal generating agent according to the present invention. This alkali metal may be the alkali metal generated from the alkali metal generating device according to the present invention. In either case, by using the alkali metal generating agent or the alkali metal generating device, it is feasible to obtain the photo-cathode with satisfactory spectral response characteristics.

A secondary-electron emitting surface according to the present invention comprises an alkali metal which emits secondary electrons corresponding to an incident electron. This alkali metal may be the alkali metal generated from the alkali metal generating agent according to the present invention or may be the alkali metal generated from the alkali metal generating device according to the present invention. In this manner, by using the alkali metal generating agent or the alkali metal generating device, it is feasible to construct the secondary-electron emitting surface with satisfactory multiplication efficiency. The incident electron to the secondary-electron emitting surface also embraces a photoelectron emitted from the photo-cathode.

Furthermore, an electron tube according to the present invention is an electron tube having a photo-cathode which emits a photoelectron corresponding to incident light, and the photo-cathode according to the present invention can be applied to the photo-cathode of the electron tube.

When the electron tube comprises the photo-cathode produced using the alkali metal generating agent or the alkali metal generating device according to the present invention as described above, it is feasible to obtain the electron tube with satisfactory photoelectric conversion characteristics. In a case where the electron tube is provided with one or more secondary-electron emitting surfaces (e.g., secondary-electron emitting surfaces of dynodes or the like), the secondary-electron emitting surfaces are also preferably produced using the alkali metal generating agent or the alkali metal generating device according to the present invention, from the aforementioned viewpoint.

An electron tube according to the present invention comprises at least an electron multiplying part comprised of one or more dynodes each having a secondary-electron emitting surface which emits secondary electrons corresponding to an incident electron. In this case, the secondary-electron emitting surface according to the present invention can also be applied to the secondary-electron emitting surface in each dynode.

When the electron tube comprises the secondary-electron emitting surface produced using the alkali metal generating agent or the alkali metal generating device according to the present invention as described above, it is feasible to obtain the electron tube with satisfactory photoelectric conversion characteristics. In this case, the photo-cathode provided in the aforementioned electron tube is also preferably produced using the alkali metal generating agent or the alkali metal generating device according to the present invention.

Furthermore, a method of production of a photo-cathode according to the present invention comprises a step of preparing the alkali metal generating agent or the alkali metal generating device according to the present invention, as a source of an alkali metal, a step of heating the alkali metal generating agent (in the case of the alkali metal generating device, a step of heating the alkali metal generating agent housed in a case), and a step of guiding the alkali metal generated by the heating of the alkali metal generating agent, to an area for formation of the photo-cathode. Through the above steps, we obtain the photo-cathode comprising the alkali metal, which emits a photoelectron corresponding to incident light.

In this manner, by using the alkali metal generating agent according to the present invention, it is feasible to obtain the photo-cathode easy in formation and excellent in reproducibility of performance.

A method of production of a secondary-electron emitting surface according to the present invention comprises a step of preparing the alkali metal generating agent or the alkali metal generating device according to the present invention, as a source of an alkali metal, a step of heating the alkali metal generating agent (in the case of the alkali metal generating device, a step of heating the alkali metal generating agent housed in a case), and guiding the alkali metal generated by the heating of the alkali metal generating agent, to an area for formation of the secondary-electron emitting surface. This can yield the secondary-electron emitting surface which emits secondary electrons corresponding to an incident electron.

In this manner, by using the alkali metal generating agent or the alkali metal generating device according to the present invention, it is feasible to obtain the secondary-electron emitting surface easy in formation and excellent in reproducibility of performance.

Furthermore, a method of production of an electron tube according to the present invention enables production of an electron tube having at least a photo-cathode comprising an alkali metal, which emits a photoelectron corresponding to incident light. Namely, the production method of the electron tube comprises the steps of preparing the alkali metal generating agent or the alkali metal generating device according to the present invention, heating the alkali metal generating agent (in the case of the alkali metal generating device, heating the alkali metal generating agent housed in a case), and guiding the alkali metal generated by the heating of the alkali metal generating agent, to an area for formation of the photo-cathode.

When the photo-cathode is produced in this manner using the alkali metal generating agent or the alkali metal generating device according to the present invention, it is feasible to obtain the electron tube excellent in reproducibility of performance. In a case where the electron tube with at least one secondary-electron emitting surface (e.g., a secondary-electron emitting surface of a dynode or the like) in addition to the photo-cathode is produced, the secondary-electron emitting surface is also preferably produced using the alkali metal generating agent or the alkali metal generating device according to the present invention, from the aforementioned viewpoint.

A method of production of an electron tube according to the present invention enables production of an electron tube having an electron multiplying part comprised of one or more dynodes each having a secondary-electron emitting surface which emits secondary electrons corresponding to an incident electron. In this case, the secondary-electron emitting surface in each dynode is produced by preparing the alkali metal generating agent or the alkali metal generating device according to the present invention, heating the alkali metal generating agent (in the case of the alkali metal generating device, heating the alkali metal generating agent housed in a case), and guiding an alkali metal generated by the heating of the alkali metal generating agent, to an area for formation of the secondary-electron emitting surface.

When the secondary-electron emitting surface of the dynode is produced in this way using the alkali metal generating agent or the alkali metal generating device according to the present invention, it is feasible to obtain the electron tube excellent in reproducibility of performance. In this case, the photo-cathode in the electron tube is also preferably produced using the alkali metal generating agent or the alkali metal generating device according to the present invention, from the aforementioned viewpoint.

Each of embodiments of the present invention can be more fully understood with the detailed description and accompanying drawings which will follow. It is noted that these embodiments are presented for illustrative purpose only but should not be construed as limiting the invention.

A scope of further application of the present invention will become apparent from the detailed description below. However, the detailed description and specific incidences will present preferred embodiments of the present invention but be given for purposes of illustration only, and it is apparent that various modifications and improvements within the spirit and scope of the present invention are obvious to those skilled in the art from the detailed description.

BRIEF DESCRIPTION OF THE DRAWINGS

FIG. 14 is a table showing various characteristics (averages) of samples of photomultiplier tubes produced using the alkali metal generating agent according to the present invention, and a comparative example of photomultiplier tubes produced using a conventional alkali metal generating agent;

FIG. 15 is a table showing Life characteristics (%) of samples of photomultiplier tubes produced using the alkali metal generating agent according to the present invention, and a comparative example of photomultiplier tubes produced using a conventional alkali metal generating agent;

BEST MODES FOR CARRYING OUT THE INVENTION

Each of embodiments of the alkali metal generating agent and others according to the present invention will be described below in detail with reference to FIGS. 1 to 17. Identical or corresponding portions will be denoted by the same reference symbols throughout the description of the drawings, without redundant description.

(Alkali Metal Generating Agent)

Figure 1:
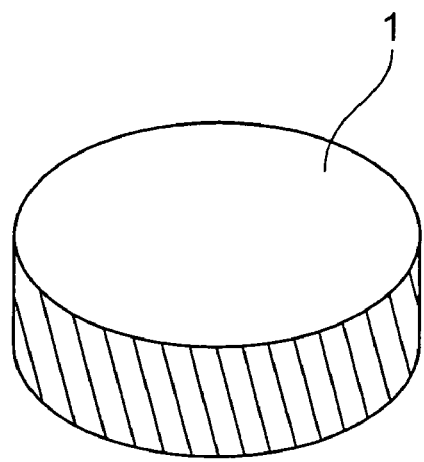
FIG. 1 is a perspective view showing a configuration of an embodiment of the alkali metal generating agent according to the present invention.

FIG. 1 is a perspective view showing a configuration of a preferred embodiment of the alkali metal generating agent according to the present invention.

As described above, the alkali metal generating agent 1 shown in FIG. 1 serves as a supply source for an alkali metal used in formation of the photo-cathode or secondary-electron emitting surface. The alkali metal generating agent 1 in FIG. 1 is formed as a columnar pellet of all the components by compression molding. This pellet form improves handlability of the alkali metal generating agent 1 and facilitates works in a case where the agent is mounted in the after-described alkali metal generating device, or works during production of the photo-cathode, secondary-electron emitting surface, and electron tube.

An oxidizer in the above alkali metal generating agent 1 is comprised of at least one vanadate with an alkali metal ion as a counter cation. This vanadate is preferably one expressed by chemical formula $RVO_3$. In this chemical formula R represents at least one metal element selected from the group consisting of Na, K, Rb, and Cs.

When the vanadate with a positive ion of the alkali metal element represented by R in the above chemical formula, as a counter cation (hereinafter referred to as the vanadate) is used as an oxidizer, the alkali metal used as a material of the photo-cathodes in practical use can be generated on a stable basis. A type of the oxidizer comprising the vanadate and a content of each component are appropriately selected so as to match a component composition of the photo-cathode to be produced or the secondary-electron emitting surface to be produced. For example, a combination of different types of materials may be included at a predetermined content ratio, or only a single type may be included.

The reducer in the above alkali metal generating agent 1 initiates the redox reaction with the oxidizer at a predetermined temperature to reduce the alkali metal ion. There are no particular restrictions on the reducer as long as the alkali metal can be generated on a stable basis; however, the reducer is preferably at least one selected from the group consisting of Si, Zr, Ti, and Al. When these Si, Zr, Ti, and Al are used each singly or in an arbitrary combination as a reducer against the aforementioned oxidizer comprising the vanadate (e.g., when a mixture of Si and Ti is used as a reducer), the alkali metal can be generated more stably.

A method of initiating the redox reaction between the reducer and the oxidizer is a method of heating the alkali metal generating agent to a predetermined temperature enough for the redox reaction to start proceeding, in an ambience adjusted in a predetermined vacuum. Here the term "ambience adjusted in a predetermined vacuum" means an ambience in which a partial pressure of residual gas is $10^{-6}$-$10^{-1}$ Pa, preferably $10^{-6}$-$10^{-3}$ Pa.

The above alkali metal generating agent 1 may contain, for example, W, $Al_2O_3$, or the like as another component than the aforementioned oxidizer and reducer.

A production method of the above alkali metal generating agent 1 will be described as an example below. The above alkali metal generating agent 1 can be produced by a technique similar to that for the conventional alkali metal generating agent using the chromate as an oxidizer, except for use of the aforementioned vanadate as an oxidizer.

Namely, the first step is to select a vanadate as an oxidizer so as to match a component composition of the photo-cathode or the secondary-electron emitting surface of dynode to be produced.

Subsequently, a measuring step, a crushing and mixing step, and a forming step are carried out in order. This measuring step is to measure appropriate amounts of the oxidizer and reducer (e.g., Si, Zr, Al, or the like). The crushing and mixing step is to put these into a crusher (e.g., an agate mortar, a ball mill, or the like) and implement crushing and mixing simultaneously. In a case where the alkali metal generating agent contains a component other than the oxidizer and reducer, this crushing and mixing step is arranged so that the component is put together with the oxidizer and reducer into the crusher to be mixed and crushed, thereby obtaining powder of the alkali metal generating agent. The forming step is to press the resultant powder of the alkali metal generating agent by a powder presser to obtain the alkali metal generating agent 1 as a pellet formed in columnar shape.

In the above forming step, the alkali metal generating agent 1 is formed into the columnar pellet by compression molding. However, where the alkali metal generating agent according to the present invention is compressively formed, there are no particular restrictions on the shape thereof. The alkali metal generating agent according to the present invention can be compressively formed as in the above embodiment, but all the components thereof may be of the powder form. For example, the powder before the forming as described above may be used as it is, or the alkali metal generating agent may be formed once into pellet shape and then crushed to be used as powder.

(Alkali Metal Generating Device)

Figure 2:
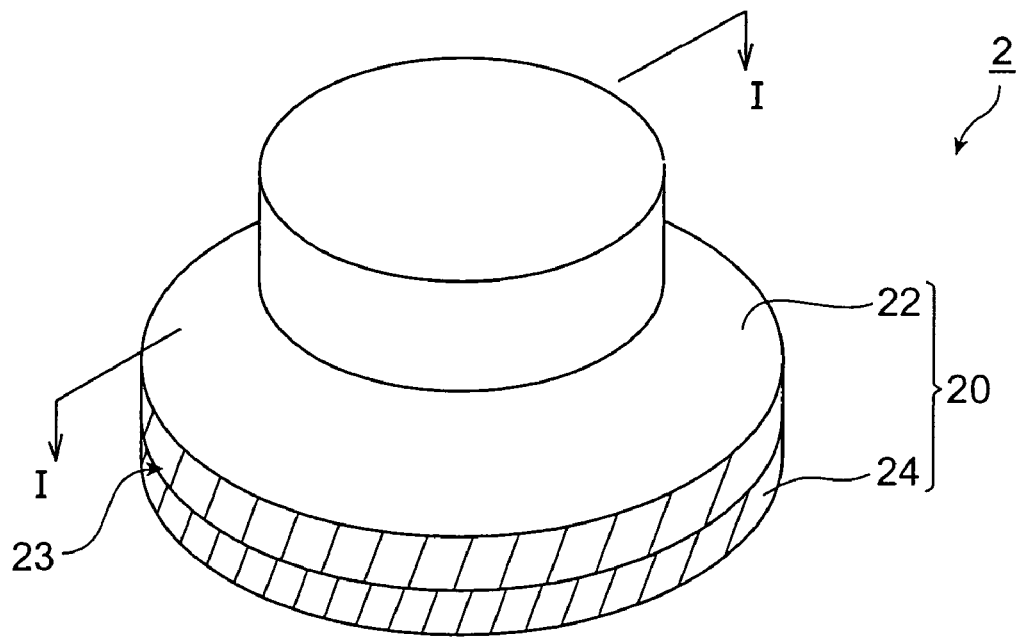
FIG. 2 is a perspective view showing a configuration of a first embodiment of the alkali metal generating device according to the present invention.
Figure 3:
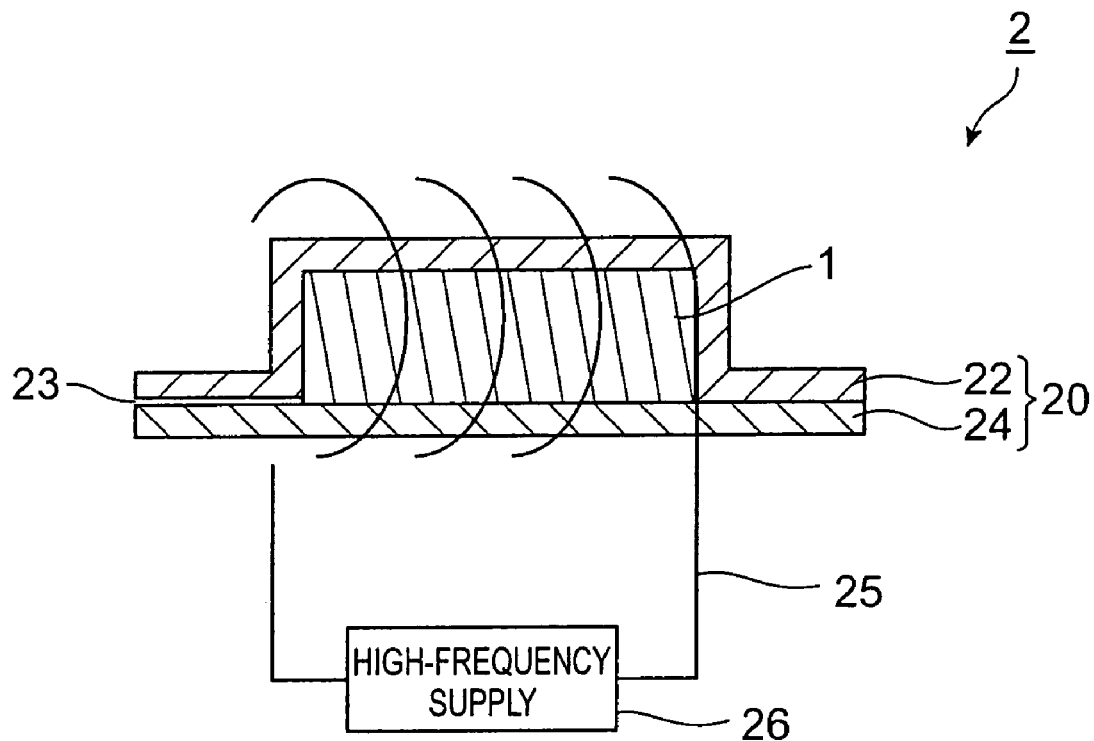
FIG. 3 is a sectional view along line I-I of the alkali metal generating device (FIG. 2) in the first embodiment.

Preferred embodiments of the alkali metal generating device according to the present invention will be described below. FIG. 2 is a perspective view showing a configuration of a first embodiment of the alkali metal generating device according to the present invention. FIG. 3 is a sectional view along line I-I of the alkali metal generating device shown in FIG. 2, which also shows a heating device.

The alkali metal generating device 2 shown in FIGS. 2 and 3 generates an alkali metal to be used in formation of the photo-cathode or the secondary-electron emitting surface. This alkali metal generating device 2 has the alkali metal generating agent 1 shown in FIG. 1, and a metal case 20 housing the alkali metal generating agent 1.

The case 20 is composed of a closed-end container 22 of a metal provided with a recess for housing the pellet of the alkali metal generating agent 1, and a lid member 24 of a metal welded to the closed-end container 22 in a state in which it covers the entire recess of the closed-end container 22. The recess of the closed-end container 22 has a capacity larger than the pellet of the alkali metal generating agent 1 and is preferably formed in a shape similar to the pellet. The closed-end container 22 is provided with such an annular flange as to surround the recess, and this flange is welded to the edge part of the lid member 24.

A non-welded portion to establish communication of the recess of the closed-end container 22 (the space for housing the alkali metal generating agent 1) with the outside of the closed-end container 22 is provided between the flange of the closed-end container 22 and the edge part of the lid member 24, and this non-welded portion serves as a discharge port 23 for discharging the vapor of the alkali metal generated from the alkali metal generating agent 1, toward a portion for formation of the photo-cathode or toward a portion for formation of the secondary-electron emitting surface of dynode.

A method of initiating the redox reaction of the alkali metal generating agent 1 housed in this alkali metal generating device 2 can be a method of heating the alkali metal generating agent 1 up to the predetermined temperature enough for the redox reaction to start proceeding, in the aforementioned ambience controlled in the predetermined vacuum.

More specifically, the alkali metal generating device preferably further comprises a heating device for generating the vapor of the alkali metal. There are no particular restrictions on this heating device as long as it has a configuration capable of heating the alkali metal generating agent 1 in the aforementioned ambience. For example, the heating device may have a configuration based on a high-frequency heating method or a resistance heating method. From a viewpoint of readily and uniformly heating the alkali metal generating agent 1, however, the heating device preferably has a configuration of heating the alkali metal generating agent 1 by high-frequency heating.

The heating device of the high-frequency heating method, as shown in FIG. 3, has a high-frequency coil 25 wound around the case 20 housing the alkali metal generating agent 1, and a high-frequency supply for supplying a high-frequency current to the coil 25. For example, the heating device may be constructed in a configuration similar to that in the case where the alkali metal generating agent containing the conventional chromate as an oxidizer is heated by the high-frequency heating method. For example, a potential configuration is such that the alkali metal generating agent 1 is preliminarily mounted in an electron tube in which the photo-cathode and/or the secondary-electron emitting surface of dynode is to be formed, it is heated by high-frequency heating to generate the alkali metal vapor in the electron tube, and it is reacted to a predetermined portion where the photo-cathode and/or the secondary-electron emitting surface of dynode is to be formed.

In the above production method of the alkali metal generating device 2, the alkali metal generating agent 1 is first produced as described above. Subsequently, the closed-end container 22 and lid member 24 are fabricated so as to match the shape and volume of this alkali metal generating agent 1. The closed-end container 22 is welded to the lid member 24 in a state in which the alkali metal generating agent 1 is housed in the recess. There are no particular restrictions on the method of fabricating the closed-end container 22 and the lid member 24 and on the method of welding the closed-end container 22 to the lid member 24, and the methods can be selected, for example, from the well-known techniques.

This alkali metal generating device 2 described was the one in which the alkali metal generating agent 1 formed in the pellet form was mounted, but another potential alkali metal generating device may be one in which the case 20 similar to the alkali metal generating device 2 is filled with a powdered alkali metal generating agent before formation of the alkali metal generating agent 1, or with a powdered alkali metal generating agent obtained by crushing the alkali metal generating agent 1.

Figure 4:
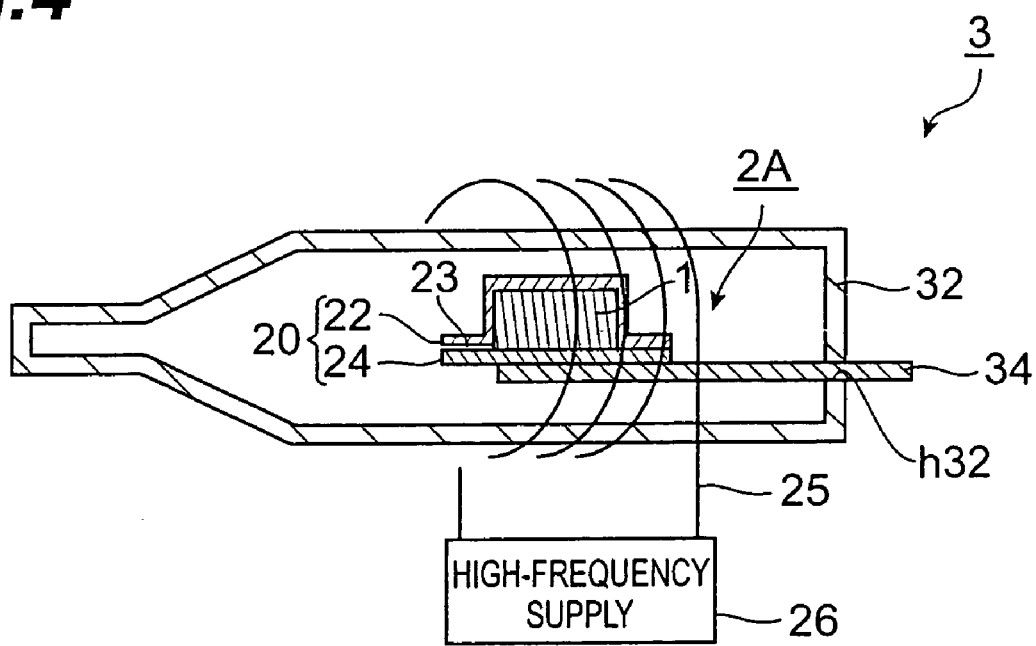
FIG. 4 is a sectional view showing a configuration of a second embodiment of the alkali metal generating device according to the present invention.

A second embodiment of the alkali metal generating device according to the present invention will be described next. FIG. 4 is a sectional view showing a configuration of the second embodiment of the alkali metal generating device according to the present invention, which also shows a heating device. The alkali metal generating device 3 shown in FIG. 4 is comprised of a main body part 2A having a configuration similar to the alkali metal generating device 2 shown in FIGS. 2 and 3, a glass ampule 32 containing the main body part 2A, and a bar-like support member 34 coupled to the case 20 of the main body part 2A (having the discharge port 23).

The glass ampule 32 has a tubular shape and, the inside diameter of the top part (hereinafter referred to as a tip portion) opposed to a stem bottom surface through which the support member 34 passes, is smaller than those of the other portions. On the occasion of forming the photo-cathode and/or the secondary-electron emitting surface of dynode, the alkali metal generating device 3 is coupled to an electron tube in which the photo-cathode and/or the secondary-electron emitting surface of dynode is to be formed. On that occasion, they are coupled so that the interior space in the glass ampule 32 is in communication with a space of a portion where the photo-cathode and/or the secondary-electron emitting surface of dynode in the electron tube is to be formed. Namely, the glass ampule 32 is opened in formation of the photo-cathode and/or the secondary-electron emitting surface.

One end of the support member 34 located in the glass ampule 32 is coupled to the exterior surface of the lid member 24 of the case 20, and the other end of the support member 34 projects through a through hole h32 provided in the glass ampule 32, to the outside of the ampule. This support member 34 is in close fit to the interior surface of the through hole h32 so that the interior of the ampule 32 is kept airtight.

For example, the heating device of the high-frequency heating method is comprised of a high-frequency supply 26 capable of generating a high-frequency current, and a coil 25 (induction furnace) capable of passing the high-frequency current, which is coupled to the high-frequency supply 26. The coil 25 is arranged so as to surround the main body part 2A from the outside of the glass ampule 32 and can heat the alkali metal generating device 3 to make the alkali metal generating device 3 start generating the vapor of the alkali metal.

In a production method of the above alkali metal generating device 3, first, the alkali metal generating agent 1 is produced as described above, and the main body part 2A is produced by a method similar to that of the alkali metal generating device 2. Subsequently, the support member 34 is welded to the main body part 2A, and thereafter the main body part 2A integrated with the support member 34 is sealed in the glass ampule 32. There are no particular restrictions on a method of welding the main body part 2A to the support member 34 and on a method of sealing them in the glass ampule 32, and they can be selected, for example, from the well-known techniques.

Figure 5:
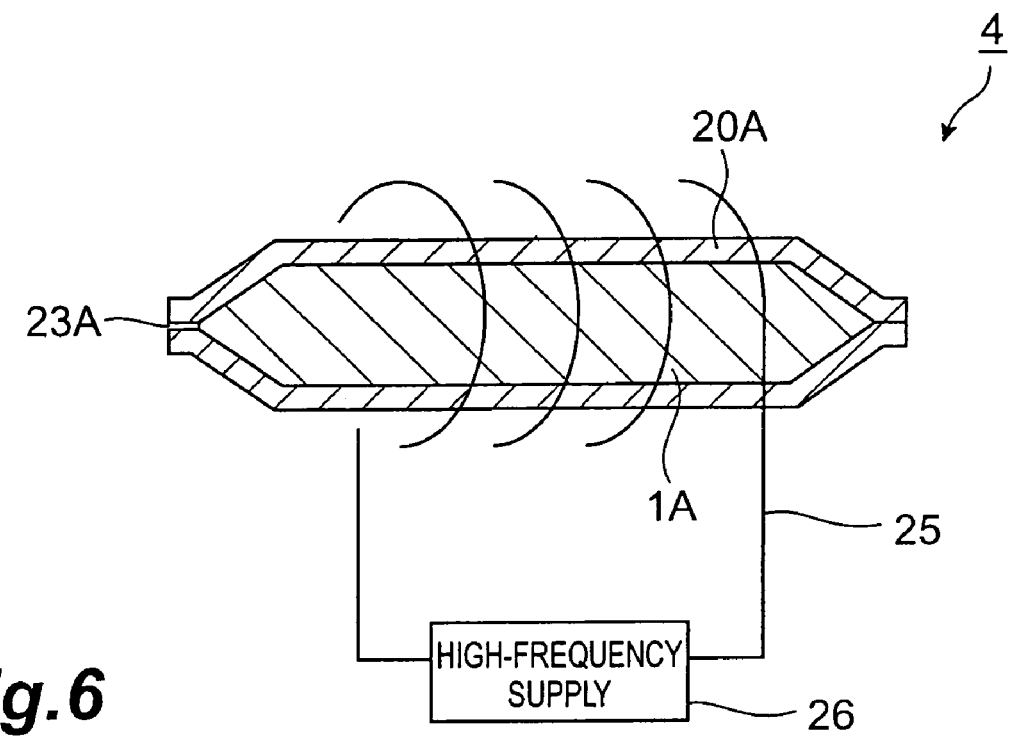
FIG. 5 is a sectional view showing a configuration of a third embodiment of the alkali metal generating device according to the present invention.

A third embodiment of the alkali metal generating device according to the present invention will be described below. FIG. 5 is a sectional view showing a configuration of the third embodiment of the alkali metal generating device according to the present invention, which also shows a heating device. The alkali metal generating device 4 shown in FIG. 5 is comprised of a powdered or pelletized alkali metal generating agent 1A, and a metal (e.g., Ni) case 20A for housing the alkali metal generating agent 1A. This alkali metal generating agent 1A has a composition similar to that of the alkali metal generating agent 1 shown in FIG. 1.

This metal case 20A is made of a metal pipe provided with an interior space for housing the alkali metal generating agent 1. The edge portions of apertures at the both ends of the case 20A are caulked, for example, by being beaten by a chisel or the like, so as to prevent the alkali metal generating agent 1A from leaking out of the interior space. However, the caulked edge part of the case 20A is provided with a non contact portion for establishing communication of the interior space with the outside of the case 20A, and this non contact portion serves as a discharge port 23 for discharging the vapor of the alkali metal generated from the alkali metal generating agent 1A, toward a portion for formation of the photo-cathode or the secondary-electron emitting surface. The size of this discharge port 23 is adjusted so as to prevent the alkali metal generating agent 1A from leaking out of the interior space.

In the case of this alkali metal generating device 4, the vapor of the alkali metal can be generated by heating the device in a manner similar to that in the aforementioned alkali metal generating devices 2 and 3. The heating device for heating this alkali metal generating device 4 is comprised of a high-frequency coil 25 wound around the case 20, and a high-frequency supply 26 for supplying a high-frequency current to the coil 25, as shown in FIG. 5.

In a production method of the above alkali metal generating device 4, first, the alkali metal generating agent 1A is produced as described above, and it is filled in the metal case (metal pipe) 20A. Subsequently, the apertures at the both ends of the metal case 20A are caulked to obtain the alkali metal generating device 4. There are no particular restrictions on a method of caulking the apertures at the both ends of the metal case 20A, and it can be selected, for example, from the well-known techniques.

Figure 6:
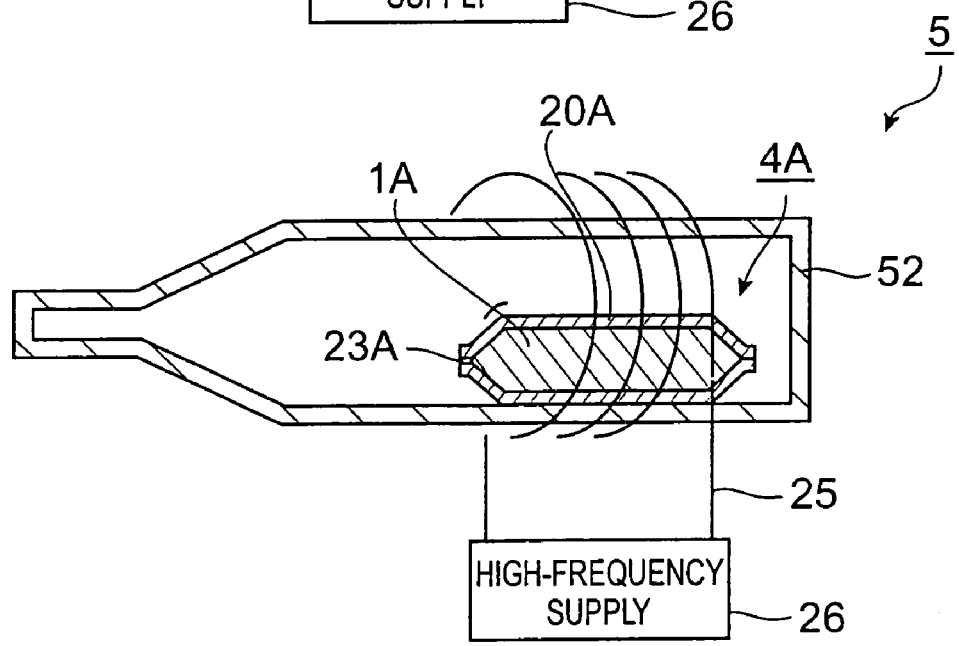
FIG. 6 is a sectional view showing a configuration of a fourth embodiment of the alkali metal generating device according to the present invention.

A fourth embodiment of the alkali metal generating device according to the present invention will be described below. FIG. 6 is a sectional view showing a configuration of the fourth embodiment of the alkali metal generating device according to the present invention, which also shows a heating device. The alkali metal generating device 5 shown in FIG. 6 is comprised of a main body part 4A having a configuration similar to the alkali metal generating device 4 shown in FIG. 5, and a glass ampule 52 containing this main body part 4A. This glass ampule 52 has a shape similar to the glass ampule 32 shown in FIG. 4. The inside diameter of the tip portion opposed to the bottom surface of the glass ampule 52 is adjusted to a size enough for the main body part 4A to be introduced into the interior.

On the occasion of forming the photo-cathode and/or the secondary-electron emitting surface of dynode, this alkali metal generating device 5 is also coupled to an electron tube in which the photo-cathode and/or the secondary-electron emitting surface of dynode is to be formed, as in the case of the alkali metal generating device 3 shown in FIG. 4. On that occasion, they are coupled so that the interior space in the glass ampule 52 is in communication with a space of a portion where the photo-cathode and/or the secondary-electron emitting surface of dynode in the electron tube is to be formed.

In the case of this alkali metal generating device 5, the vapor of the alkali metal can also be generated by heating the device in a manner similar to that in the case of the aforementioned alkali metal generating devices 2 to 4. The heating device for heating this alkali metal generating device 4 is comprised of a high-frequency coil 25 wound so as to surround the case 20, and a high-frequency supply 26 for supplying a high-frequency current to the coil 25, as shown in FIG. 6.

In a production method of the above alkali metal generating device 5, first, the alkali metal generating agent 1A is produced as described above, and the main body part 4A is produced in the same manner as the alkali metal generating device 4. Subsequently, the main body part 4A is sealed in the glass ampule 52. There are no particular restrictions on a method of sealing the main body part 4A in the glass ampule 52, and it can be selected, for example, from the well-known techniques.

Figure 7:
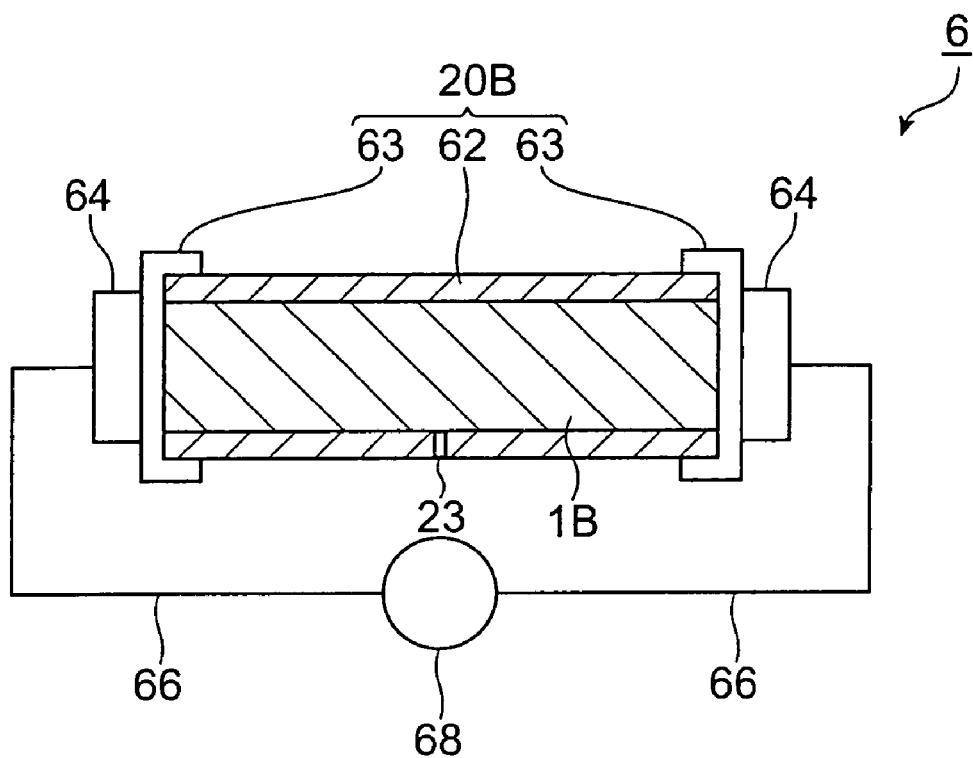
FIG. 7 is a sectional view showing a configuration of a fifth embodiment of the alkali metal generating device according to the present invention.

A fifth embodiment of the alkali metal generating device according to the present invention will be described below. FIG. 7 is a sectional view showing a configuration of the fifth embodiment of the alkali metal generating device according to the present invention (including a heating device). The alkali metal generating device 6 shown in FIG. 7 is mainly comprised of a powdered or pelletized alkali metal generating agent 1B, a metal case 20B housing the alkali metal generating agent 1A, two electrodes 64 placed at predetermined locations of this metal case 20B, and an energizing device 68 electrically coupled to each of the two electrodes 64 and having a power supply for letting an electric current flow from one electrode 64 to the other electrode 64.

This alkali metal generating agent 1B has a composition similar to that of the alkali metal generating agent 1 shown in FIG. 1. The case 20B is composed of a metal pipe 62 having an interior space for housing the alkali metal generating agent 1, and two metal lid members 63 closing the apertures at the both ends of the metal pipe 62. Each of the two electrodes 64 is coupled to either of the two metal lid members 63. The energizing device 68 is electrically coupled through a conductor 66 to each of the two electrodes 64.

Furthermore, a discharge port 23 for establishing communication of the interior space with the outside of the case 20B is provided in the side face of the metal pipe 62. The alkali metal generating device is able to discharge the vapor of the alkali metal generated from the alkali metal generating agent 1A, through this discharge port 23 toward a portion for formation of the photo-cathode or the secondary-electron emitting surface. The size of this discharge port 23 is adjusted so as to prevent the alkali metal generating agent 1B from leaking out of the interior space. There are no particular restrictions on the shape of the discharge port 23 as long as it has the size as described above, and it may be, for example, of slit shape.

In the case of this alkali metal generating device 6, it can heat the alkali metal generating agent 1B on the basis of the resistance heating method by the energizing device 68. For example, when the electric current of several amperes is fed to the metal case 20B, the alkali metal generating agent 1B is heated by Joule heat generated in the metal case 20B, whereby the vapor of the alkali metal can be generated.

In s production method of the above alkali metal generating device 6, the alkali metal generating agent 1B is first produced by a method similar to that of the aforementioned alkali metal generating agent 1, and the alkali metal generating agent 1B is filled in the metal pipe 62. Subsequently, the both ends of the metal pipe 62 are closed each by welding the lid member 63 so as to close the entire aperture. Furthermore, the electrodes 64 are coupled to the two lid members 63 and each of the electrodes 64 is coupled to the energizing device 68, thereby obtaining the alkali metal generating device 6.

(Photo-Cathode, Secondary-Electron Emitting Surface, and Electron Tube)

Preferred embodiments of the photo-cathode, secondary-electron emitting surface, and electron tube according to the present invention will be described below.

Figure 8:
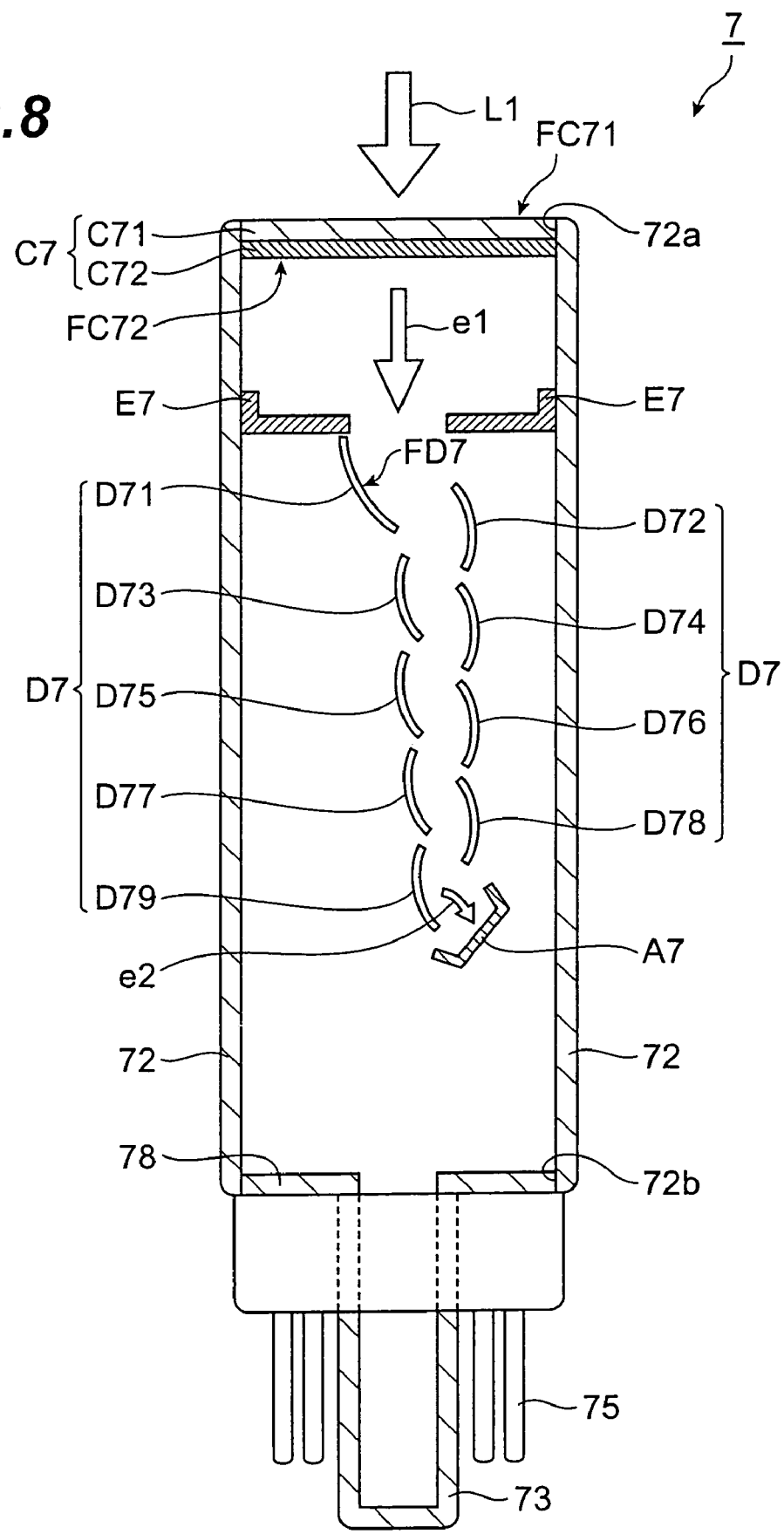
FIG. 8 is an illustration showing a configuration of a photomultiplier tube as a first embodiment of the electron tube according to the present invention.

First, a first embodiment of the electron tube according to the present invention will be described. FIG. 8 is an illustration showing a configuration of a photomultiplier tube as the first embodiment of the electron tube according to the present invention. The photomultiplier tube 7 shown in FIG. 8 has the configuration of a head-on type photomultiplier tube having a transmissive photo-cathode (more precisely, in the case of the photomultiplier tube 7 shown in FIG. 8, the electron multiplying part is of a line focus type). This photomultiplier tube 7 is mainly comprised of a photo-cathode C7; an electron multiplying part D7 with dynodes D71-D79 having secondary-electron emitting surfaces FD7 to which photoelectrons e1 emitted from the photo-cathode C7 are made to incident and which emit secondary electrons e2 by making use of collision of the photoelectrons e1; a focusing electrode E7 located between the photo-cathode C7 and the electron multiplying part D72 and provided for focusing the photoelectrons e1 emitted from the photo-cathode C7 and guiding the photoelectrons e1 to the electron multiplying part D7; an anode A7 for collecting multiplied secondary electrons e2 and extracting them as an electric current to the outside; and a glass side tube 72 of a tubular shape (e.g., a cylindrical shape) (e.g., a Kovar glass, a UV glass, or the like, or a metal material such as a Kovar metal, stainless steel, or the like) for housing each of these electrodes; a voltage applying part (bleeder circuit) for regulation of potential is coupled to each electrode.

The photo-cathode C7 is mainly comprised of a substrate C71 (face plate), and a layer C72 of a photoelectron emitting material (e.g., an intermetallic compound or a compound semiconductor) in a film form (hereinafter referred to as photoelectron emitting material layer C72) for emitting photoelectrons e1 corresponding to incident light L1.

This photo-cathode C7 is fixed to one aperture 72a of the side tube 72. Namely, the substrate C71 that can transmit light to be utilized (e.g., a glass substrate) is fusion-bonded and fixed to one aperture 72a of the side tube 72 so that its light receiving surface FC71 is directed to the outside. The photoelectron emitting material layer C72 is formed on the internal surface (back surface) opposite to the light receiving surface FC71 of the substrate C71.

The photoelectron emitting material layer C72 contains the alkali metal generated from either of the aforementioned alkali metal generating agent and alkali metal generating device carrying it. Here the photoelectron emitting material layer C72 is an intermetallic compound (compound semiconductor) containing the alkali metal as a constituent material, or a compound semiconductor activated with the alkali metal. Specific examples of such materials include Sb—Cs, Sb—Rb—Cs, Sb—K—Cs, Sb—Na—K, Sb—Na—K—Cs, GaAs(Cs), InGaAs(Cs), InP/InGaAsP(Cs), InP/InGaAs(Cs), and so on. In the above examples, for example, (Cs) in GaAs (Cs) means that the material was obtained by an activation treatment of GaAs with Cs. The same also applies to (Cs) in InP/InGaAsP(Cs) and in InP/InGaAs(Cs) hereinafter. Further examples include such photoelectron emitting materials as Cs—Te and Ag—O—Cs.

This photoelectron emitting material layer C72 is obtained by forming a constituent material of a photoelectron emitting material to react with the alkali metal, e.g. antimony or a compound semiconductor, on the back surface of the substrate C71 and then reacting it with the vapor of the alkali metal.

A stem plate 78 of glass (e.g., a Kovar glass, a UV glass, or the like, or possibly a metal material such as a Kovar metal or stainless steel) is welded and fixed to the other aperture 72b of the side tube 72. In this manner, a hermetic container is constructed of the side tube 72, the photo-cathode C7, and the stem plate 78.

Furthermore, an exhaust tube 73 is fixed to the center of the stem plate 4. This exhaust tube 73 is used to evacuate the interior of the hermetic container into a vacuum state by a vacuum pump, after completion of assembly of the photomultiplier tube 7, and is also used as a guide tube for guiding the alkali metal vapor into the hermetic container during formation of the photoelectron emitting material layer C72.

The electron multiplying part D7 is provided with the first dynode D71 to the ninth dynode D79 each having a plurality of plate-like dynode elements. Each of the first dynode D71 to the ninth dynode D79 is comprised of a substrate, and a layer of a secondary-electron emitting material in film shape placed on the substrate and having a secondary-electron emitting surface FD7 to emit secondary electrons e2 by making use of incident photoelectrons e1. In the description hereinafter, the layer of the secondary-electron emitting material will be referred to as a secondary-electron emitting material layer.

Each of the first dynode D71 to the ninth dynode D79 is supported in the hermetic container, for example, by a stem pin 75 (e.g., made of a Kovar metal) provided so as to penetrate the hermetic container, and the distal end of each stem pin 75 is electrically coupled to the first dynode D71-the ninth dynode D79. The hermetic container is provided with pin holes for the respective stem pins 75 to pass, and, for example, each pin hole is filled with a tablet (e.g., made of a Kovar glass) used as a hermetic seal. Each stem pin 75 is fixed through the tablet to the hermetic container. Furthermore, the stem pins 75 include the pins for the first dynode D71-the ninth dynode D79 and a pin for the anode A7.

In this electron multiplying part D7, the secondary-electron emitting material of the secondary-electron emitting material layer of each dynode contains the alkali metal generated from either of the aforementioned alkali metal generating agent and alkali metal generating device carrying it. There are no particular restrictions on the secondary-electron emitting material in the secondary-electron emitting material layer as long as it is a material containing the alkali metal as a constituent material or a material activated with the alkali metal. Specific examples of such materials include intermetallic compounds (compound semiconductors) of Sb with any one of the alkali metals.

Furthermore, the anode A7 fixed to the stem pin 75 is placed between the electron multiplying part D7 and the stem plate 78. The focusing electrode E7 is placed between the electron multiplying part D7 and the photo-cathode C7. This focusing electrode E7 is provided with an aperture for discharging the focused stream of photoelectrons e1 toward the electron multiplying part D7.

The other ends of the stem pins 75 coupled each to the first dynode D71-the ninth dynode D79 and to the anode A7 are electrically coupled to a voltage applying part, whereby a predetermined voltage is supplied to the first dynode D71-the ninth dynode D79 and to the anode A7. Their potentials are set so that the photo-cathode C7 has the same potential as the focusing electrode E7 and so that the first dynode D71-the ninth dynode D79 and the anode A7 have their respective potentials decreasing in order from the top stage.

Accordingly, light L1 incident to the light receiving surface FC71 of the photo-cathode C7 is converted into photoelectrons e1 to be emitted from the internal surface FC72. Then the photoelectrons e1 are incident to the electron multiplying part D7, to be multiplied in multiple stages at the first dynode D71 to the ninth dynode D79, and electrons are finally incident to the anode A7 to be outputted as an electric current from the anode A7.

A method of production of the photomultiplier tube 7 (a preferred embodiment of the production method of the photo-cathode according to the present invention, the production method of the secondary-electron emitting surface according to the present invention, and the production method of the electron tube according to the present invention) will be described below. There are no particular restrictions on the conditions and procedure in the method of production of the photomultiplier tube 7 except that the photo-cathode C7 and the first dynode D71 to the ninth dynode D79 are formed using the alkali metal generating agent or the alkali metal generating device according to the present invention. The photomultiplier tube 7 can be fabricated by the well-known techniques.

Namely, the side tube 72 is first integrated with the substrate C71 by heating (or a glass bulb in which the side tube and the substrate are integrally formed may be used). In this stage, the photoelectron emitting material layer C72 is not formed yet on the substrate C71 of the photo-cathode C7 (or the substrate is in a state before alkali activation).

Subsequently, the anode A7, focusing electrode E7, and electron multiplying part D7 are assembled on the lead pins 75 passing through the stem plate 78, and the assembly is inserted into the aperture 72b of the side tube 72. In this stage, the secondary-electron emitting surfaces are not formed yet on the substrates to become the dynodes in the electron multiplying part D7 (or the substrates are in a state before alkali activation). Thereafter, the stem plate 78 is integrated with the side tube 72 in the same manner as the substrate C71 was, thereby obtaining a hermetic container.

Figure 9:
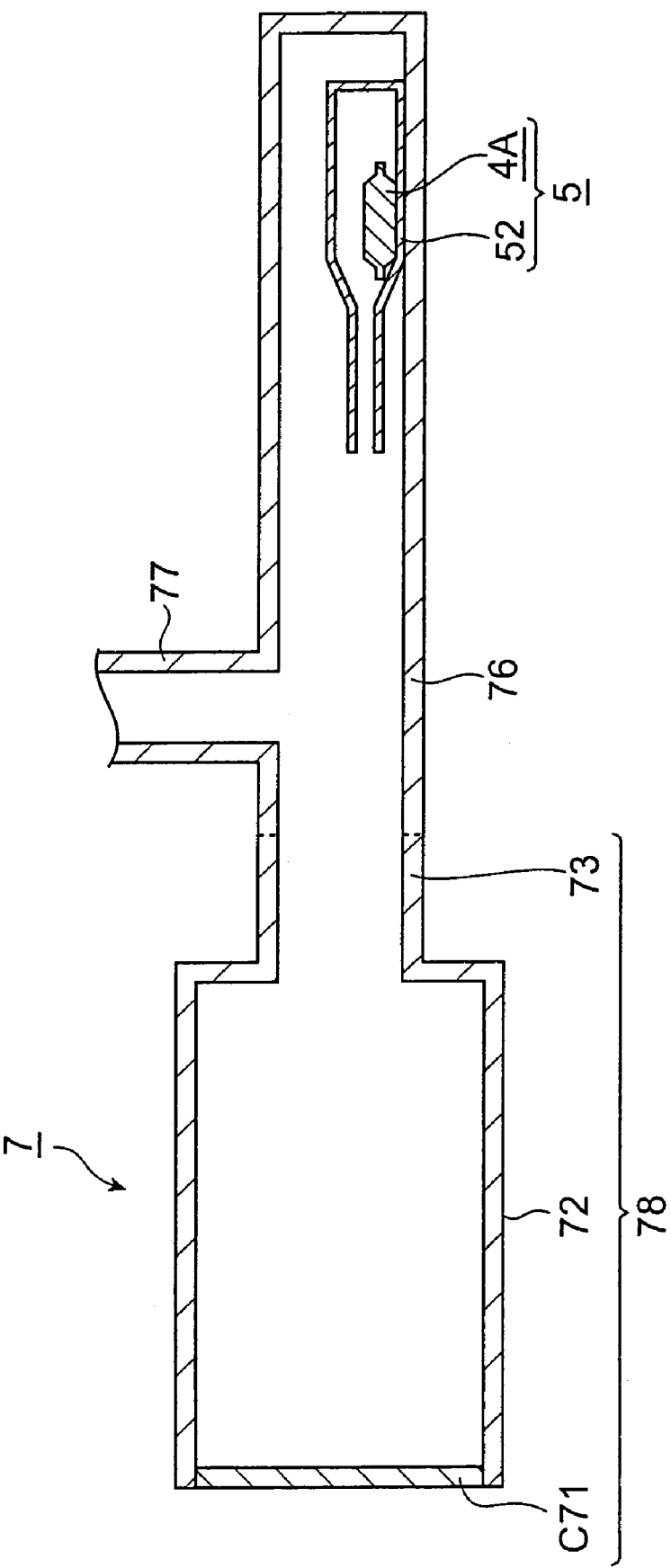
FIG. 9 is an illustration for illustrating steps of production of the photo-cathode and dynodes in the photomultiplier tube using the alkali metal generating device shown in FIG. 6.

Described below is an example in which the photo-cathode C7 and the first dynode D71 to the ninth dynode D79 in the photomultiplier tube 7 are formed using the alkali metal generating device 5 shown in FIG. 6. FIG. 9 is an illustration for explaining production steps of forming the photo-cathode C7 and the first dynode D71 to the ninth dynode D79 in the photomultiplier tube 7, using the alkali metal generating device 5 shown in FIG. 6. In FIG. 9, the detailed internal configuration of the photomultiplier tube 7 is omitted.

First, the layer of the constituent material of the photoelectron emitting material layer C72 to react with the alkali metal is preliminarily formed on the substrate C71, and the layer of the constituent material of the secondary-electron emitting material layer to react with the alkali metal is preliminarily formed on the substrates of the respective dynodes D7. For example, an evaporation source (an evaporation source consisting of the constituent material of the photoelectron emitting material layer C72 except for the alkali metal, or an evaporation source consisting of the constituent material of the secondary-electron emitting material layers except for the alkali metal, such as Sb) is preliminarily mounted in the hermetic container.

Subsequently, the interior of the hermetic container is maintained in a predetermined vacuum state (in which the total pressure of residual gas inside the hermetic container is, for example, $10^{-6}$-$10^{-3}$ Pa) by a vacuum pump. In this vacuum state the evaporation source is energized or heated by high-frequency heating to evaporate an evaporative material forming the evaporation source. Thereafter, the hermetic container is put into an electric furnace or the like and maintained at a predetermined temperature to deposit the evaporative material on the substrate C71 or on the substrate of each dynode D7. It can also be contemplated that the evaporative material is preliminarily deposited on the substrate C71 or on the substrate of each dynode D7, using a separate evaporation system.

After the evaporation, an opening portion is formed in the exhaust tube 73, whereupon the evaporative material inside the exhaust tube 73 is released to the outside. Next, as shown in FIG. 9, a closed-end glass tube 76 is prepared with the alkali metal generating device 5 being placed therein near the bottom part in a state in which the tip of ampule 52 is open, and an aperture of the glass tube 76 is coupled in an airtight state to the opening of the exhaust tube 73. The glass tube 76 is provided with another aperture on its side face and this side aperture is hermetically coupled to an aperture of glass tube 77 coupled to a vacuum pump. Thereafter, the vacuum pump is actuated to maintain the interior of the hermetic container in a predetermined vacuum state (in which the total pressure of residual gas of the hermetic container is, for example, $10^{-6}$-$10^{-3}$ Pa) through the exhaust tube 73.

Then the alkali metal generating device 5 is heated by the aforementioned heating device of the high-frequency heating method to advance the redox reaction of the oxidizer (vanadate) and the reducer of the alkali metal generating agent 1A in the alkali metal generating device 5, thereby generating the vapor of the alkali metal.

At this time, the oxidizer with an alkali metal ion as a counter cation (vanadate) has the oxidizing power weaker than the chromate with an alkali metal ion as a counter cation, so that the redox reaction with the reducer proceeds moderately as compared with the case of the chromate. For this reason, the alkali metal vapor can be generated on a stable basis, without rupture of the alkali metal generating agent 1A itself or the case 20A housing it.

In other words, after the progress of oxidation reaction is once initiated by the heating device of the high-frequency heating method, the adjustment of reaction temperature can be readily accomplished by heating the, exhaust tube 73. Then the Cs vapor is guided to the distal portion of the glass ampule 52, so that the vapor of Cs or liquid of Cs is collected at the distal part. Then the part of the hermetic container is put into an electric furnace and the interior of the electric furnace is maintained at a predetermined temperature (e.g., 200° C.). On that occasion, the alkali metal generating device 5 is moved toward the hermetic container to insert the distal portion of the ampule 52 of the alkali metal generating device 5 into the hermetic container.

This permits the distal portion of the ampule 52 to be kept at the predetermined temperature in the electric furnace, whereby the vapor of the alkali metal such as Cs can be stably discharged from the distal portion. Namely, the photo-cathode C7 and the first dynode D71 to the ninth dynode D79 with performance comparable to that of the photo-cathode and dynodes produced using the conventional chromate can be produced without any difficulty and with good reproducibility.

The vapor of the alkali metal such as Cs stably discharged from the distal portion of the glass ampule 52 into the hermetic container in this way reacts with the layer of the preliminary form for reacting with the alkali metal of the photo-cathode C7 to form the photoelectron emitting material layer C72 or with the layers of the preliminary form for reacting with the alkali metal of the first dynode D71 to the ninth dynode D79 to form the secondary-electron emitting material layers, so as to make the photoelectron emitting material or the secondary-electron emitting material. Then the photoelectron emitting material layer C72 with satisfactory spectral response characteristics or the secondary-electron emitting surfaces FD7 with satisfactory amplification efficiency are formed.

Then the distal end of the alkali metal generating device 5 is taken out of the hermetic container and the alkali metal generating device 5 is moved to the bottom side of the glass tube 76. Thereafter, the glass tube 76 is cut off from the exhaust tube 73.

The above operations are repeated for every alkali metal generating agent used, to form the photoelectron emitting material layer C72 in a predetermined chemical composition on the substrate C71 and form the secondary-electron emitting material layers in a predetermined chemical composition on the substrates of the dynodes. After use of the last alkali metal generating device 5, the vacuum pump is actuated in a state in which the interior of the photomultiplier tube 7 is maintained at a predetermined temperature, whereby the residual gas in the photomultiplier tube 7 is thoroughly removed, so as to eliminate the alkali metal or the gas evolving from the other evaporation sources, which remains physically adsorbed at portions other than the photoelectron emitting material or the secondary-electron emitting material in the photomultiplier tube 7. Thereafter, the opening part of the exhaust tube 73 in the hermetic container is sealed to obtain the photomultiplier tube 7 with satisfactory photoelectric conversion characteristics.

Figure 10:
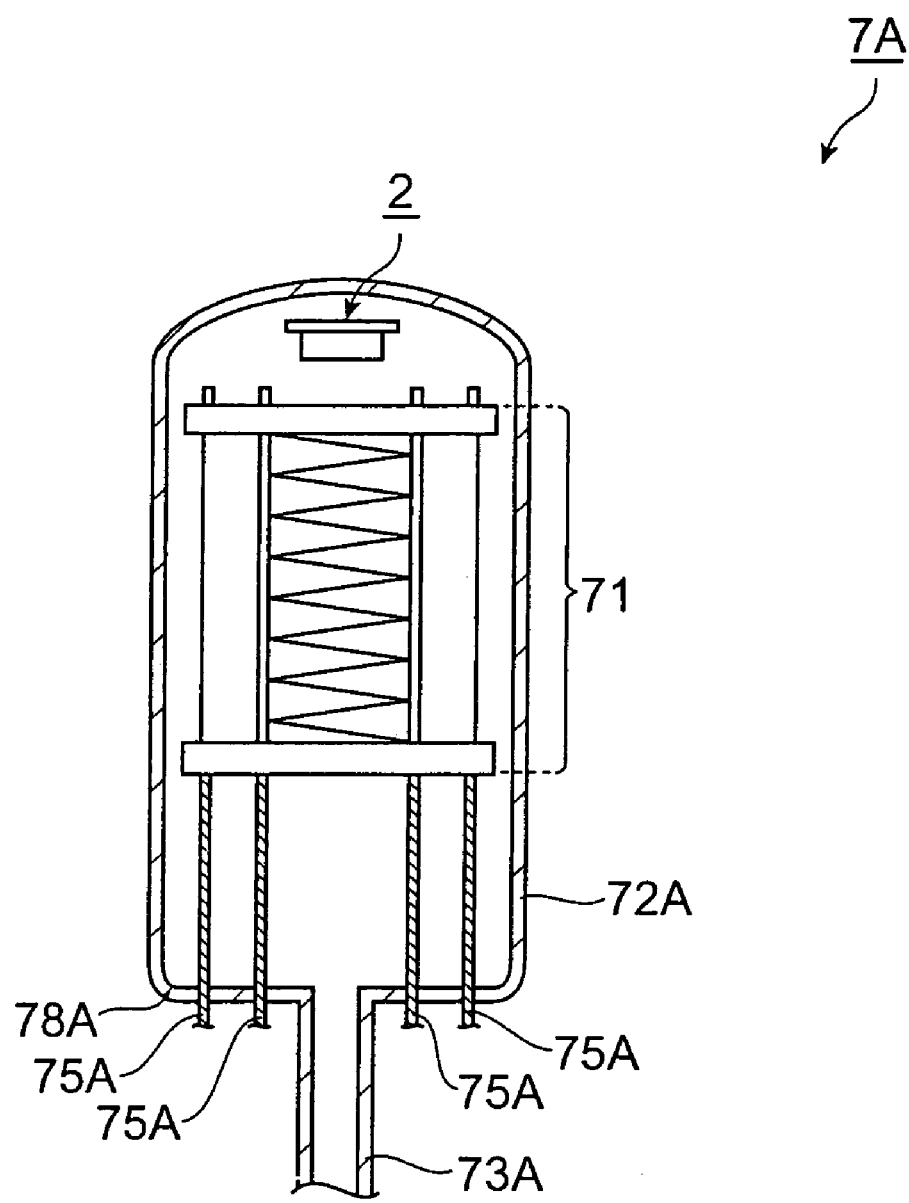
FIG. 10 is an illustration showing a configuration of a photomultiplier tube as a second embodiment of the electron tube according to the present invention.

A second embodiment of the electron tube according to the present invention will be described below. FIG. 10 is an illustration showing a configuration of a photomultiplier tube as the second embodiment of the electron tube according to the present invention. This FIG. 10 shows another configuration of the photomultiplier tube 7 shown in FIG. 8.

The photomultiplier tube 7A shown in FIG. 10 is mainly comprised of an electrode part 71, an alkali metal generating device 2 fixed to the electrode part 71, a glass container with a nearly cylindrical contour housing the electrode part 71 and the alkali metal generating device 2, and stem pins 75A electrically coupled to respective electrodes of the electrode part 71. The glass container is comprised of a glass side tube 72A and a glass stem plate 78A. The electrode part 71 is constructed of an electron multiplying part consisting of a photo-cathode, a focusing electrode, and a plurality of dynodes, and an anode, as in the case of the photomultiplier tube 7 of FIG. 8. Each stem pin 75A is coupled to a voltage applying part, as in the photomultiplier tube 7 of FIG. 8.

The alkali metal generating device 2 has a configuration similar to the alkali metal generating device shown in FIGS. 2 and 3. The alkali metal generating device 2 is used in formation of the photo-cathode and the dynodes of the electron multiplying part in the electrode part 71. This alkali metal generating device 2 is fixed to the electrode part 71 by metal wire. FIG. 10 shows the configuration in which there is one alkali metal generating device 2, but it is also possible to adopt a configuration wherein a plurality of alkali metal generating devices 2 with their respective alkali metal generating agents 1 having different chemical compositions according to the chemical composition of the photo-cathode to be formed or according to the chemical composition of the secondary-electron emitting surfaces of the dynodes are fixed to the electrode part 71.

This photomultiplier tube 7A is a side-on type photomultiplier tube having a reflective photo-cathode formed on a metal substrate. For that purpose, the columnar side tube 72A forming the glass container is optically transparent to light to be used, and the substrate of the photo-cathode placed in the electrode part 71 is a substrate of a metal such as Ni, for example. This photomultiplier tube 7A has the configuration, for example, similar to the known side-on type photomultiplier tube, except for the electrode part 71 and alkali metal generating device 2 fixed to the electrode part 71.

In a production method of the above photomultiplier tube 7A, first, the glass stem plate 78A having the lead pins 75A and the electrode part 71 fixed to the lead pins 75A is fixed to an aperture of tubular glass side tube 72A with one bottom surface closed. On that occasion, the alkali metal generating device 2 is also attached to the electrode part 71. An exhaust tube 73A coupled to the stem plate 78A is once opened, and the opening part thereof is coupled to a suction port of a vacuum pump.

In this case, a layer (e.g., an antimony layer) for reacting with the alkali metal to form an intermetallic compound is preliminarily formed on the photo-cathode forming substrate and on the secondary-electron emitting surfaces of dynodes.

In either of the above cases, the interior of the glass container is maintained in a predetermined vacuum state by the vacuum pump. In this vacuum state the heating device of the aforementioned high-frequency heating method heats the alkali metal generating device 2 or evaporation source from the outside of the glass container. This results in forming the photoelectron emitting material layer of the photo-cathode and the secondary-electron emitting material layers of the dynodes.

In the case of this photomultiplier tube 7A, when the alkali metal generating device 2 is heated by the heating device of the high-frequency heating method, the oxidizer (vanadate) with an alkali metal ion as a counter cation also moderately advances the redox reaction with the reducer, as compared with the case of the chromate. For this reason, the alkali metal vapor can be generated on a stable basis, without rupture of the alkali metal generating agent 1 itself or the case 20 housing it. The appearance will not be spoiled even if the case 20 is left in the glass container.

After the progress of oxidation reaction is once initiated by the heating device of the high-frequency heating method, the glass container is put into an electric furnace kept at a predetermined temperature and is subjected to temperature control, whereby the vapor of the alkali metal can be made stably to react with the photo-cathode forming portion or the portions for formation of the secondary-electron emitting surfaces. The alkali metal vapor reacts with the layer of the preliminary form for reacting with the alkali metal of the photo-cathode to form the photoelectron emitting material layer or with the layers of the preliminary form for reacting with the alkali metal of the dynodes to form the secondary-electron emitting material layers, thereby making the photoelectron emitting material or the secondary-electron emitting material. Then the photo-cathode with satisfactory spectral response characteristics or the secondary-electron emitting surfaces with satisfactory multiplication efficiency are formed.

After the formation of the photo-cathode or the secondary-electron emitting surfaces, the vacuum pump is actuated in a state in which the interior of the photomultiplier tube 7A is maintained at a predetermined temperature, whereby the residual gas in the photomultiplier tube 7A is thoroughly removed. This results in eliminating the alkali metal or the gas evolving from the other evaporation sources, which remains physically adsorbed at the portions other than the photoelectron emitting material or the secondary-electron emitting surfaces in the photomultiplier tube 7. Thereafter, the opening part of the exhaust tube 73A of the glass container is sealed to obtain the photomultiplier tube 7A with satisfactory photoelectric conversion characteristics.

In the formation of this photomultiplier tube 7A, the alkali metal generating device 3 shown in FIG. 4 or the alkali metal generating device 5 shown in FIG. 6 may be used instead of the alkali metal generating device 2. In this case, the photomultiplier tube 7A is also produced according to procedure similar to that of the aforementioned photomultiplier tube 7.

The above described the various electron tubes with the photomultiplier tube, as the electron tubes according to the present invention, but the electron tube according to the present invention, in the case having the configuration of the photomultiplier tube, may be any electron tube if at least one of the photoelectron emitting material layer of the photo-cathode and the secondary-electron emitting material layers of the dynodes is formed using the vapor of the alkali metal generated from the alkali metal generating agent or the alkali metal generating device carrying it according to the present invention. For example, as in the above embodiments (the photomultiplier tube 7 and the photomultiplier tube 7A), the photo-cathode and the dynodes both may be formed using the vapor of the alkali metal generated from the alkali metal generating agent or the alkali metal generating device carrying it according to the present invention. Only either of the photoelectron emitting material layer of the photo-cathode and the secondary-electron emitting material layers of the dynodes may be formed using the vapor of the alkali metal generated from the alkali metal generating agent or the alkali metal generating device carrying it according to the present invention. It is, however, preferable to adopt the former in terms of production efficiency.

In the electron tube according to the present invention, where it has the configuration with dynodes, as in the above embodiments (photomultiplier tube 7 and photomultiplier tube 7A), there are no particular restrictions on the shape of the dynodes. For example, the above embodiments described the examples wherein the line focus type dynodes were mounted as dynodes D7, but the electron tube may be provided with dynodes of the box type, the Venetian blind type, the mesh type, the metal channel dynode type, and so on.

Figure 11:
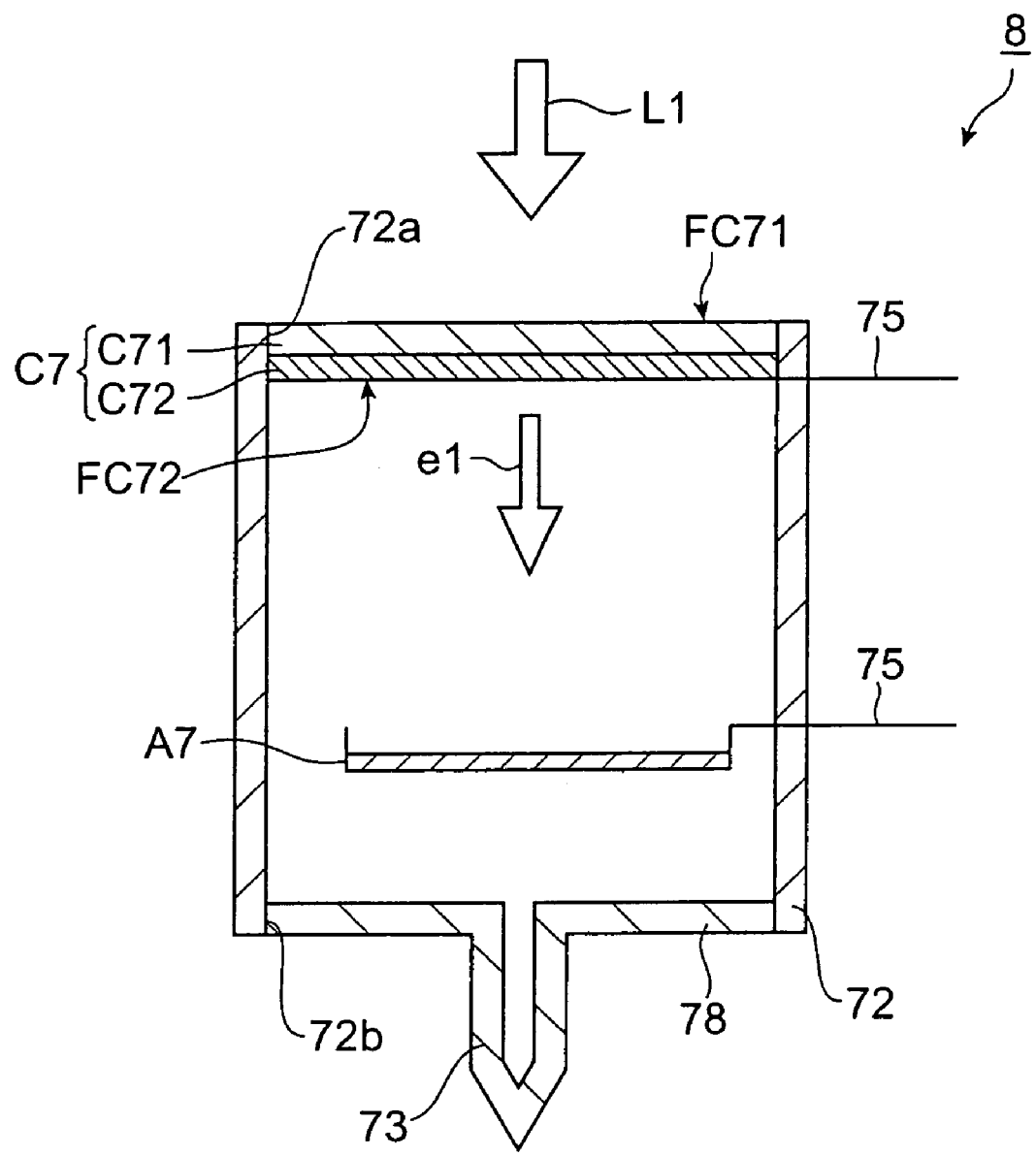
FIG. 11 is an illustration showing a configuration of a photo-tube as a third embodiment of the electron tube according to the present invention.

A third embodiment of the electron tube according to the present invention will be described below. FIG. 11 is an illustration showing a configuration of a photo-tube as the third embodiment of the electron tube according to the present invention.

The photo-tube 8 shown in FIG. 11 has a configuration similar to the photomultiplier tube 7, except that the photo-tube 8 does not have the focusing electrode E7 and the electron multiplying part D7 forming the photomultiplier tube 7 shown in FIG. 8. The photo-cathode C7 of this photo-tube 8 can also be readily produced in the same manner as the photo-cathode C7 of the aforementioned photomultiplier tubes 7 and 7A. Then satisfactory photoelectric conversion characteristics are achieved as to the resultant photo-tube 8. A glass container of this electron tube 8 is comprised of a glass side tube 72, a photo-cathode C7, and a glass stem plate 78.

Figure 12:
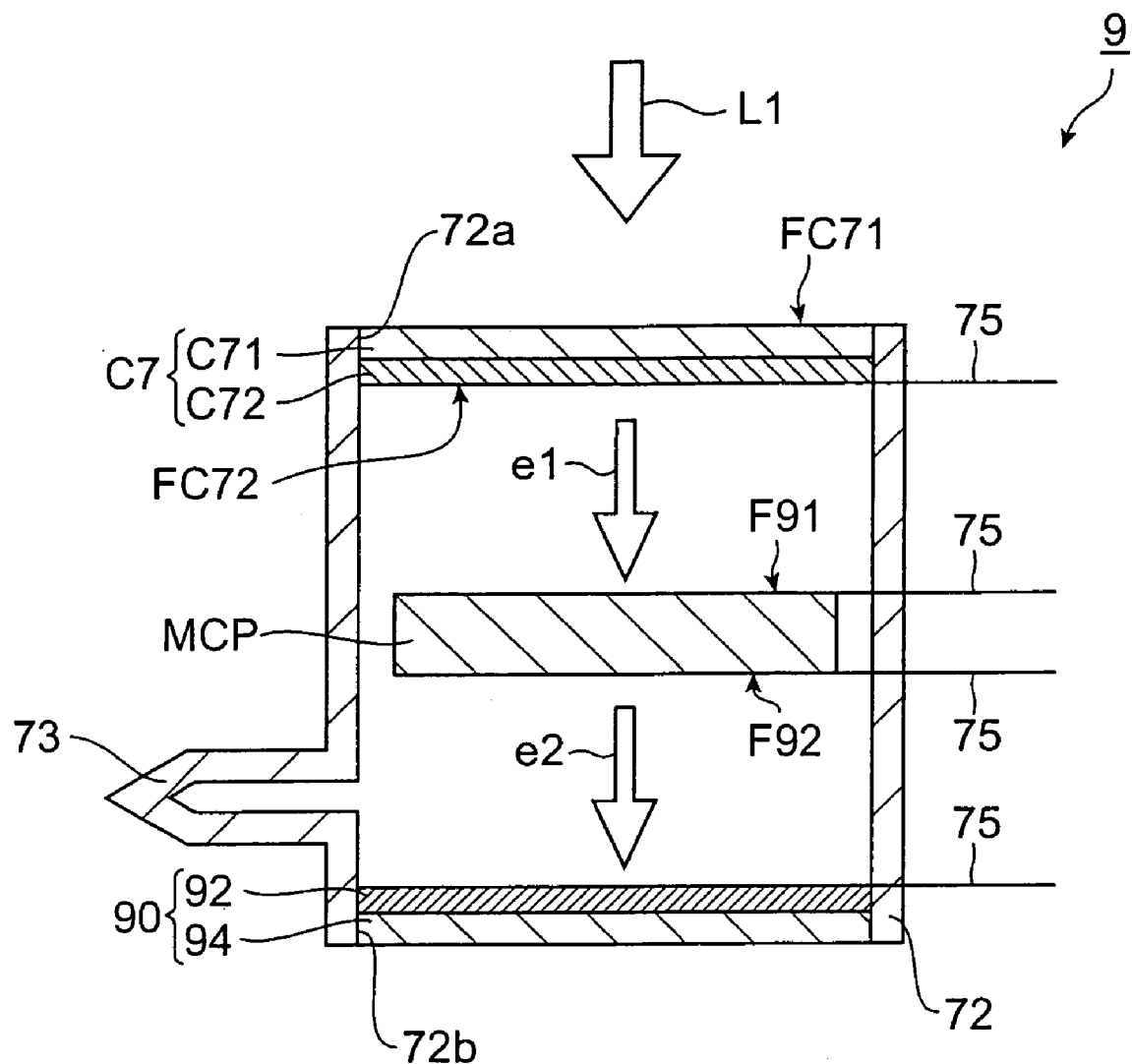
FIG. 12 is an illustration showing a configuration of an image tube (image intensifier) as a fourth embodiment of the electron tube according to the present invention.

A fourth embodiment of the electron tube according to the present invention will be described below. FIG. 12 is an illustration showing a configuration of an image tube (image intensifier) as the fourth embodiment of the electron tube according to the present invention.

The image intensifier 9 shown in FIG. 12 is provided with a photo-cathode C7, a micro-channel plate MCP for multiplying photoelectrons e1 emitted from the photo-cathode C7, and a fluorescent screen 90 for converting electrons e2 emitted from the micro-channel plate MCP, into light. An exhaust tube is provided in the side tube 72. The MCP is not subjected to alkali activation with the alkali metal generating agent. The image tube 9 may be constructed in a configuration without MCP. The above image tube also embraces an X-ray image tube for converting an X-ray image into a visible image.

In the case of the intensifier 9 shown in FIG. 12, the photo-cathode C7 is configured so that a photoelectron emitting material layer C72 (e.g., a photo-cathode in a composition of GaAs—CsO or the like) performs photoelectric conversion of incident light L1 carrying optical two-dimensional information and so that an inside surface FC72 emits photoelectrons e1 corresponding to the incident light L1. Then the micro-channel plate MCP is maintained at a high potential relative to the photo-cathode C7 by voltage applying part 74 and, upon incidence of photoelectrons e1, the micro-channel plate emits secondary electrons e2 by making use of collision of the photoelectrons e1. For example, the voltage of about 1000 V is placed between entrance surface F91 for photoelectrons e1 and secondary-electron exit surface F92 in the micro-channel plate MCP by a predetermined voltage applying part, so as to achieve an electron multiplication rate of several thousand to several ten thousand times.

The fluorescent screen 90 is comprised of a transparent substrate 94, a phosphor layer 92 formed on the transparent substrate 94, and an electrode 75 formed on the surface of the phosphor layer 92. This electrode 75 is an electrode for accelerating multiplied secondary electrons e2, and is regulated at a predetermined potential to apply a voltage. Namely, this electrode 75 is also maintained at a high potential relative to the secondary-electron exit surface F92 and voltage applying part 74 of the micro-channel plate MCP.

Furthermore, there are no particular restrictions on constituent materials forming the phosphor layer 92 and on constituent materials forming the substrate 94, and the well-known materials can be used for them. For example, it is also possible to employ a configuration in which an optical fiber plate constructed of a bundle of optical fibers is used as the substrate 94 and in which a thin film of metal is placed between the optical fiber plate and the phosphor layer.

The photo-cathode C7 of this image intensifier 9 can also be readily produced in the same manner as the photo-cathode C7 of the aforementioned photomultiplier tubes 7 and 7A. Then satisfactory photoelectric conversion characteristics are achieved as to the resultant image intensifier 9.

Figure 13:
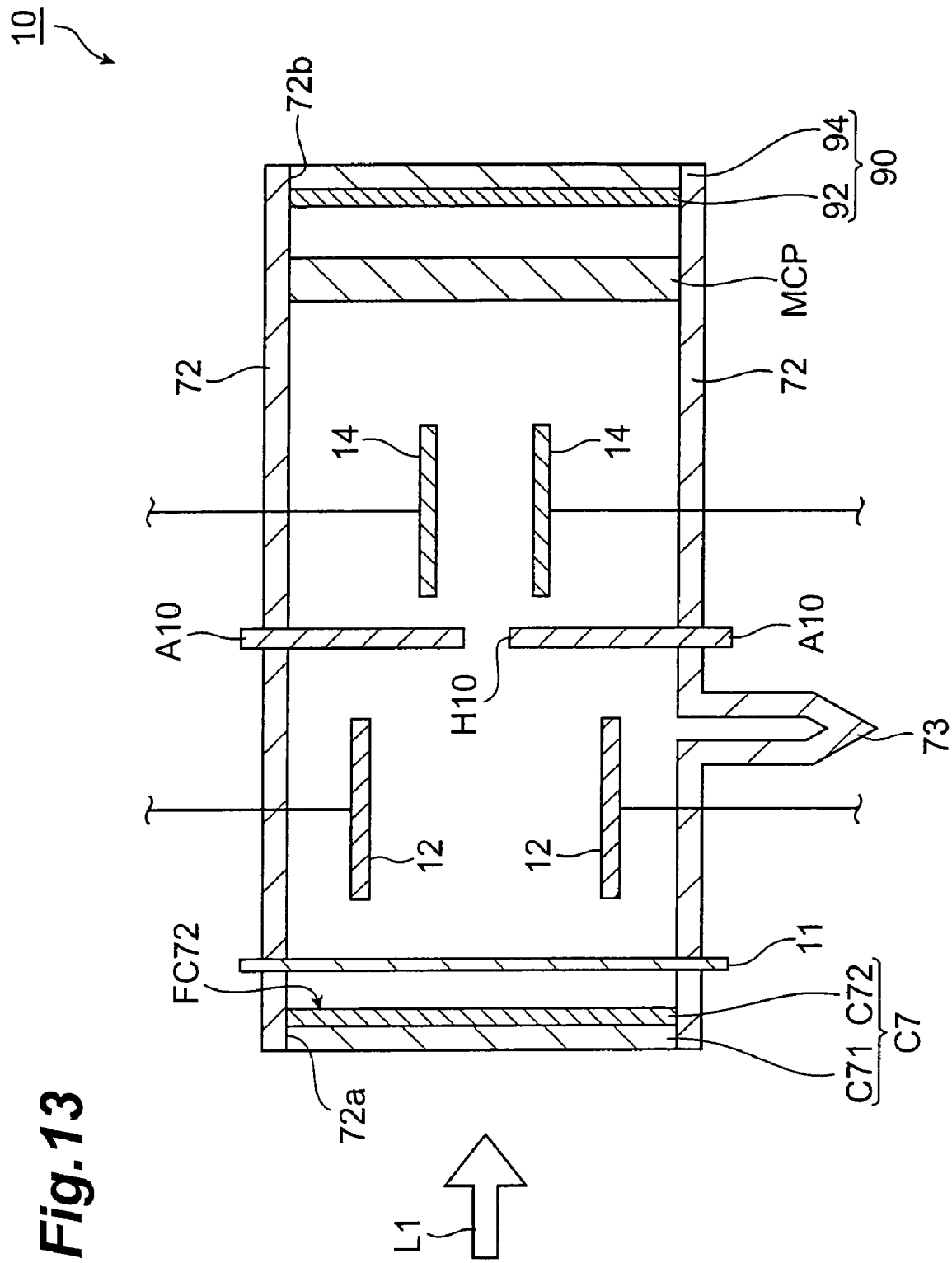
FIG. 13 is an illustration showing a configuration of a streak tube as a fifth embodiment of the electron tube according to the present invention.

A fifth embodiment of the electron tube according to the present invention will be described. FIG. 13 is an illustration showing a configuration of a streak tube as the fifth embodiment of the electron tube according to the present invention.

In the streak tube 10 shown in FIG. 13, just as in the photomultiplier tube 7 shown in FIG. 8, the photo-cathode C7 is placed on the side of one aperture 72a of side tube 72. Measured light L1 incident from the outside is converted into photoelectrons in the photoelectron emitting material layer C72 of this photo-cathode C7.

An accelerating electrode 11 of flat plate shape for accelerating the photoelectrons emitted from the inner surface FC72 is placed next to the photo-cathode C7 in the side tube 72. This accelerating electrode 11 is placed so that a normal to the electrode surface is nearly parallel to a normal to the inner surface FC72. A focusing electrode 12 for focusing the primary electrons accelerated by the accelerating electrode 11 is placed next to the accelerating electrode 11. The focusing electrode 12 is comprised of a pair of electrodes of flat plate shape, and is placed so that electrode surfaces of the respective electrodes are parallel to each other and nearly perpendicular to the inner surface FC72. An anode A10 of disk shape is placed next to the focusing electrode 12, is formed in a configuration with a through hole H10 for the primary electrons focused by the focusing electrode 12 to pass, and is arranged to electrically attract the electrons so as to guide them through the through hole H10.

Furthermore, a deflecting electrode 14 for sweeping the electrons passing through the aperture H10 of anode A10 at high speed is placed next to the anode A10. This deflecting electrode 14 is comprised of a pair of electrodes of flat plate shape located as opposed to each other. Normals to electrode surfaces in this pair of electrodes are parallel to each other and each of the normals is perpendicular to the normal to the inner surface FC72. A predetermined deflection voltage is applied between the pair of electrodes of flat plate shape, whereby the primary electrons emitted through the aperture H10 from the anode A10 are swept in a predetermined direction.

A micro-channel plate MCP for multiplying the electrons swept by the deflecting electrode 14 is placed next to the deflecting electrode 14. It is noted that this streak tube 10 may be constructed in a configuration without this micro-channel plate MCP.

A fluorescent screen 90 for converting electrons emitted from the micro-channel plate MCP, into light is placed next to the micro-channel plate MCP. This fluorescent screen 90 has a configuration similar to the fluorescent surface 90 shown in FIG. 12. A hermetic container is constructed of the face plate C71, transparent substrate 94, and side tube 72.

In the above-described streak tube 10, when measured light L1 is guided through a slit plate to the photo-cathode C7, this measured light is converted into an electron image and the electron image is accelerated by the accelerating electrode 11 to be attracted to the anode A10. Then this electron image passes the anode A10 to go into between the two deflecting electrodes 14, where electrons are swept at high speed in a direction parallel to the normal direction to the electrode surfaces of the deflecting electrode 14. The reason why electrons are swept at high speed is that the number of electrons passing the deflecting electrode 14 varies corresponding to temporal change of optical intensity of the measured light varying at high speed against time.

The electrons thus swept at high speed are multiplied by the micro-channel plate MCP, and electrons multiplied by the micro-channel plate MCP are converted into an optical image (also called a streak image) at the fluorescent screen 90. In this way, a temporal change of intensity of the measured light is converted to a spatial change of intensity at the fluorescent screen 90. Since in the operation of the streak tube the electrons are swept in synchronism with their passing time, the temporal change can be determined by analyzing the spatial change of optical intensity, i.e., the streak image projected on the phosphor electrode 90.

The photo-cathode of this streak tube 10 can also be readily produced in the same manner as in the aforementioned photomultiplier tubes 7 and 7A. Then satisfactory photoelectric conversion characteristics can be achieved as to the resultant streak tube 10.

(Experiments)

The present invention will be further described below in more detail with samples and a comparative example of the alkali metal generating agent according to the present invention. It is, however, noted that the present invention is by no means intended to be limited to the samples of examples below.

(Samples)

The Inventors fabricated as samples, a plurality of photomultiplier tubes (having a configuration similar to FIG. 10) in a configuration similar to the commercially available side-on type photomultiplier tubes, except that the photo-cathode mounted was one formed using the alkali metal generating agent described below (antimony alkali photo-cathode: Sb—Cs, substrate material: Ni) and the secondary-electron emitting surfaces mounted were those formed using the alkali metal generating agent described below (Cs—Sb).

The alkali metal generating agent for formation of the photo-cathode was one containing a vanadate ($CsVO_3$) as an oxidizer and Si as a reducer, and having the total weight of 94 mg. The shape of samples of the alkali metal generating agent was the pellet shape similar to FIG. 1, and a substance amount ratio was $CsVO_3:Si=1:1.1$.

In the samples the secondary-electron emitting surfaces were also formed using the alkali metal generating agent for formation of the photo-cathode.

The alkali metal generating agent was prepared by successively carrying out the aforementioned measuring step, crushing and mixing step, and forming step with the mixture of the above vanadate.

Then each of these samples of the alkali metal generating agent was housed in the metal case 20 shown in FIGS. 2 and 3, and this metal case 20 was housed in the glass ampule 32 as shown in FIG. 4, thereby fabricating the alkali metal generating device of the configuration similar to the alkali metal generating device 3.

The photo-cathode and secondary-electron emitting surfaces were fabricated by a method similar to the production method of the photomultiplier tube 7 described with FIG. 9, except for the use of the alkali metal generating device, to obtain photomultiplier tubes.

Comparative Example

On the other hand, the Inventors also prepared as a comparative example, a plurality of photomultiplier tubes having a configuration similar to the commercially available side-on type photomultiplier tubes, by a method similar to that of the above samples. The photo-cathode mounted in the photomultiplier tubes in this comparative example was a photo-cathode formed by using the conventional alkali metal generating agent containing a chromate ($Cs_2CrO_4$) as an oxidizer and Si as a reducer (antimony alkali photo-cathode: Sb—Cs). The total weight of the alkali metal generating agent in the comparative example was 82 mg, and a substance amount ratio thereof was $Cs_2CrO_4:Si=1:1.3$.

(Characteristic Evaluation Tests)

The photomultiplier tubes of the samples and comparative example prepared as described above were evaluated by measuring various characteristics of cathode output (Sk: ᵤA/1 m), anode output (Sp: ᵤA/1 m), dark current (Idb:nA), and After Pulse (%) and also measuring radiant sensitivity (mA/W) and Life (%) (secular change of Sp). FIG. 14 to FIG. 17 are tables and graphs showing the measurement results thereof. The measurements of the above various characteristics were carried out based on the methods described in "Photomultiplier Tubes -Their fundamentals and applications-," (Editorial Board of Hamamatsu Photonics K.K.) (e.g., p34-p39: "Fundamental characteristics of photo-cathode," p60-p73: "Various characteristics of photomultiplier tube," and so on).

Figure 16:
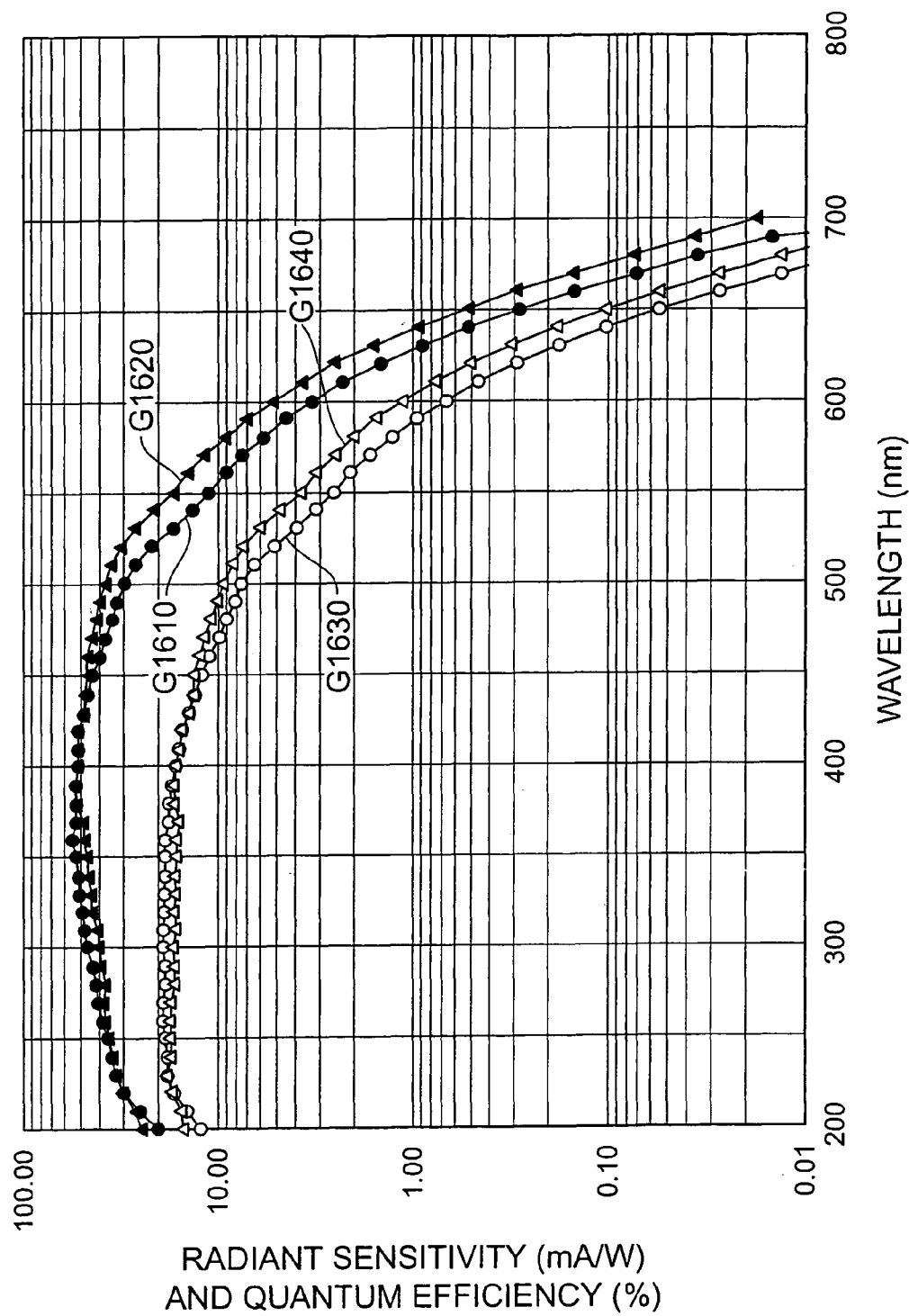
FIG. 16 is a graph showing radiant sensitivity characteristics and quantum efficiencies of samples of photomultiplier tubes produced using the alkali metal generating agent according to the present invention, and a comparative example of photomultiplier tubes produced using a conventional alkali metal generating agent.
Figure 17:
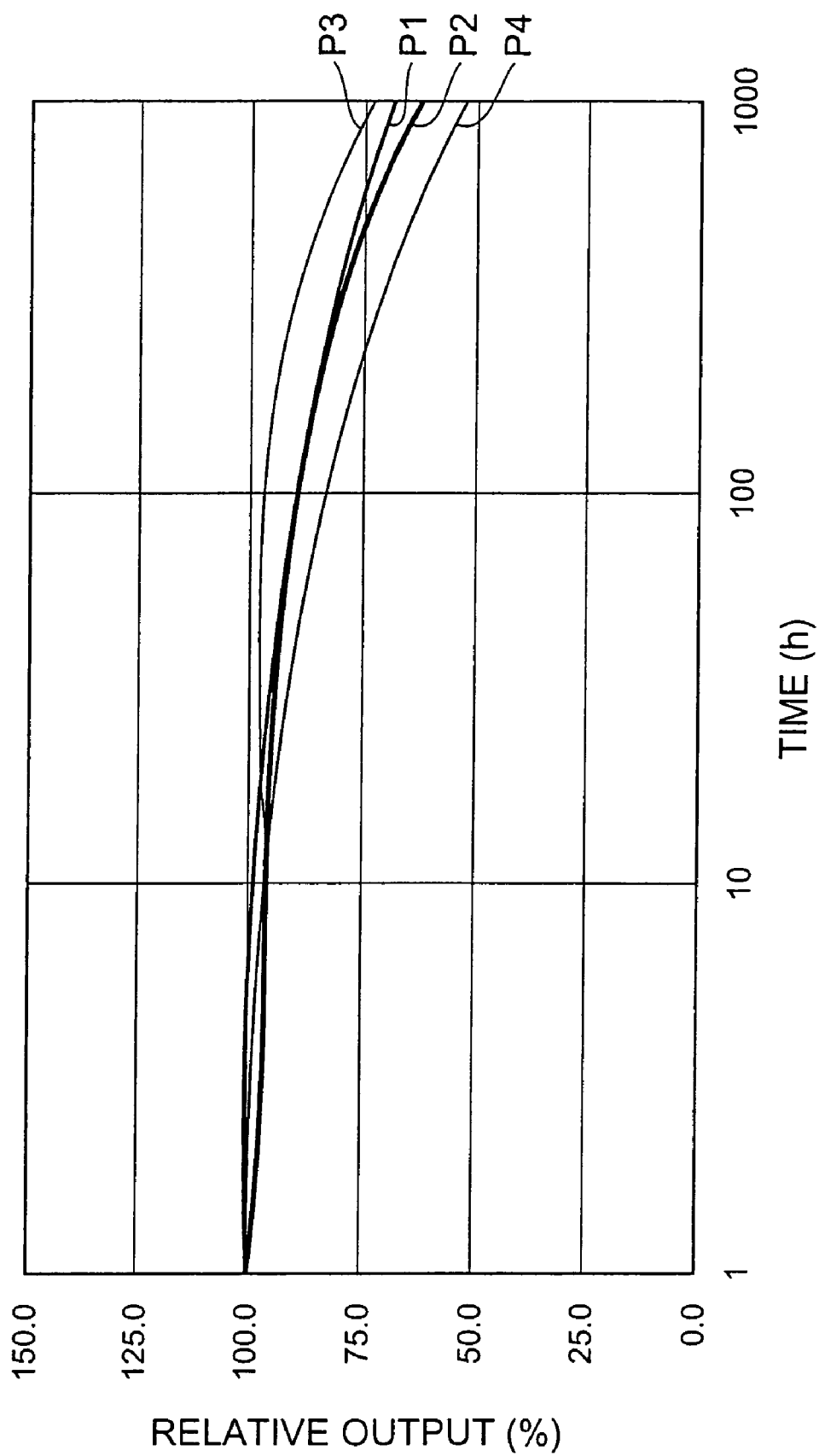
FIG. 17 is a graph showing relative outputs of Life characteristics of a comparative example of photomultiplier tubes produced using a conventional alkali metal generating agent, on the basis of the Life characteristics of samples of photomultiplier tubes produced using the alkali metal generating agent according to the present invention.

FIG. 14 is a table showing the various characteristics (averages) in the samples of the photomultiplier tubes fabricated using the alkali metal generating agent according to the present invention and in the comparative example of the photomultiplier tubes fabricated using the conventional alkali metal generating agent. FIG. 15 is a table showing Life characteristics (%) in the samples of the photomultiplier tubes fabricated using the alkali metal generating agent according to the present invention and in the comparative example of the photomultiplier tubes fabricated using the conventional alkali metal generating agent. FIG. 16 is a graph showing the radiant sensitivity characteristics and quantum efficiencies in the samples of the photomultiplier tubes fabricated using the alkali metal generating agent according to the present invention and in the comparative example of the photomultiplier tubes fabricated using the conventional alkali metal generating agent. In this FIG. 16, graph G1610 indicates the radiant sensitivity of the photomultiplier tubes of the samples, graph G1620 the radiant sensitivity of the photomultiplier tubes of the comparative example, graph G1630 the quantum efficiency of the photomultiplier tubes of the samples, and graph G1640 the quantum efficiency of the photomultiplier tubes of the comparative example. FIG. 17 is a graph showing relative outputs of Life characteristics in the comparative example of the photomultiplier tubes fabricated using the conventional alkali metal generating agent, on the basis of the Life characteristics of the samples of the photomultiplier tubes fabricated using the alkali metal generating agent according to the present invention. In this FIG. 17, graph P1 indicates the Life characteristics of the photomultiplier tubes of the samples, and graphs P2-P4 indicate relative outputs of Life characteristics of the photomultiplier tubes of the comparative example, on the basis of the graph P1.

Particularly, the relative outputs P2-P4 of Life characteristics of the photomultiplier tubes of the comparative example (commercially available photomultiplier tubes) in FIG. 17 were obtained by measuring data of a plurality of (35) samples. Namely, graph P2 indicates the average of all data, graph P3 the average of all data+$\sigma$ ($\sigma$ is a standard deviation), and graph P4 the average of all data—$\sigma$ ($\sigma$ is a standard deviation).

As apparent from the measurement results shown in FIG. 16, it was confirmed that the samples fabricated as the photomultiplier tubes of the present invention had the radiant sensitivity and quantum efficiency equivalent to those of the conventional photomultiplier tubes of the comparative example.

As also seen from the table shown in FIG. 15, it was confirmed that the photomultiplier tubes of the samples had the Life characteristics equivalent to those of the conventional photomultiplier tubes of the comparative example. This Life characteristic evaluation test was conducted under the following conditions: the operating current (output current) of each photomultiplier tube was 100 $\mu$A and the applied voltage between the photo-cathode and the anode was 1000 V. The values of Life characteristics (relative outputs) in the table shown in FIG. 15 indicate relative values relative to 100% at the value of the anode output (Sp) after a lapse of one hour since a start of measurement.

Furthermore, as shown in FIG. 17, it was confirmed that the samples of the photomultiplier tubes according to the present invention (graph P1 indicating the Life characteristics of the samples in FIG. 17 represents an average of five samples) yielded the relative outputs indicating Life characteristics approximately equivalent to those of the photomultiplier tubes of the comparative example and had excellent reproducibility of characteristics.

As shown in the table of FIG. 14, it was confirmed that the photomultiplier tubes of the samples (the photomultiplier tubes according to the present invention) had the cathode output, anode output, dark current, and After Pulse characteristics equivalent to those of the conventional photomultiplier tubes of the comparative example. The measurement results of After Pulse characteristics were obtained by using an LED (semiconductor laser) to make each photomultiplier tube in the samples and comparative example output a pulse signal and performing the calculation based on After Pulse generated between 0.5 and 10 $\mu$sec after the output of the signal.

It is apparent that the present invention can be modified in various ways, from the above description of the present invention. Such modifications are to be understood not to depart from the spirit and scope of the present invention, and all improvements obvious to those skilled in the art should be included in the scope of claims which will follow.

INDUSTRIAL APPLICABILITY

As described above, the present invention enables the reaction rate to be readily controlled by controlling only the reaction temperature in the redox reaction between the oxidizer with an alkali metal ion as a counter cation (vanadate) and the reducer. For this reason, it becomes feasible to provide the alkali metal generating agent for formation of the photo-cathode or the secondary-electron emitting surface capable of stably generating the alkali metal at predetermined temperature. It also becomes feasible to provide the alkali metal generating device provided with the alkali metal generating agent and thereby permitting easy control of the alkali metal generating rate.

By using the alkali metal generating agent or the alkali metal generating device according to the present invention, it is feasible to obtain the photo-cathode with satisfactory spectral response characteristics, the secondary-electron emitting surface with satisfactory multiplication efficiency, and the electron tube with satisfactory optical characteristics and electrical characteristics.

Furthermore, by using the alkali metal generating agent or the alkali metal generating device according to the present invention, it becomes feasible to provide the production method of the photo-cathode, the production method of the secondary-electron emitting surface, and the production method of the electron tube easy in formation and excellent in reproducibility of resultant performance.

The invention claimed is:

1. A method of producing a photo-cathode for emitting a photoelectron corresponding to incident light or a secondary-electron emitting surface for emitting secondary electrons corresponding to an incident electron, the method comprising the steps of:
preparing a container in which a layer comprised of constituent materials of the photo-cathode or secondary-electron emitting surface to react with an alkali metal is formed;
preparing an alkali metal generating device which includes an alkali metal generating agent as a supply source of an alkali metal, the alkali metal generating agent comprising: an oxidizer comprising at least one vanadate with an alkali metal ion as a counter cation; and a reducer for initiating a redox reaction with the oxidizer at a predetermined temperature to reduce the alkali metal ion;

setting the alkali metal generating device in a space continuing an inner space of the container;

depressurizing the space where the alkali metal generating device is set and the inner space of the container by a predetermined vacuum;

heating the alkali metal generating device set in the depressurized space to generate an alkali metal vapor in the depressurized space;

guiding the alkali metal vapor generated from the heated alkali metal generating device, while controlling a temperature of the container, to an area where the layer is formed; and wherein, in the alkali metal generating agent, the vanadate is expressed by a chemical formula $RVO_3$, where R is at least one metal element selected the group consisting of Na, K, Rh, and Cs.

2. A method according to claim 1, wherein, in the alkali metal generating agent, the reducer is at least one selected from the group consisting of Si, Zr, Ti, and Al.

3. A method according to claim 1, the alkali metal generating agent being of a powder form.

4. A method according, to claim 1, the alkali metal generating agent being formed in a pellet form having a predetermined shape by compression molding.

5. A method according to claim 1, wherein the alkali metal generating device further comprises:

a case housing the alkali metal generating agent; and a discharge port provided in the case and adapted for discharging the alkali metal vapor, from an interior space of the case housing the supply source, toward the exterior of the case.

6. A method according to claim 5, wherein the case is made of a metal.

7. A method according to claim 5, wherein the case comprises:

a hollow container of a metal having apertures at both ends and provided with the discharge port in a side face thereof; and lid members of a metal covering the respective apertures at the both ends of the hollow container.

8. A method according to claim 5, wherein the case is a hollow container of a metal having apertures at both ends thereof, wherein the apertures at the both ends of the hollow container are hermetically closed in a state in which the hollow container secures an interior space for housing the alkali metal generating agent, and wherein the discharge port is provided in at least one of the both ends of the hollow container hermetically closed.

9. A method according to claim 5, wherein the alkali metal generating agent is formed in a pellet form having a predetermined shape, wherein the case is comprised of a closed-end container of a metal having a recess for housing the alkali metal generating agent, and a lid member of a metal welded to the closed-end container in a state in which the lid member covers an aperture of the recess, and wherein the discharge port of the case is formed in a non-welded portion between the closed-end container and the lid member.

10. A method according to claim 5, wherein the alkali metal generating device further comprises a glass ampule housing the entire case.

11. A method according to claim 5, wherein the alkali metal generating device further comprises a heating device for initiating the redox reaction of the alkali metal generating agent to generate the vapor of the alkali metal.

12. A method according to claim 11, wherein the heating device comprises a high-frequency supply for heating the alkali metal generating agent by high-frequency heating.

13. A photo-cathode for emitting a photoelectron corresponding to incident light, the photo-cathode comprising the alkali metal generated a method according to claim 1.

14. A secondary-electron emitting surface for emitting secondary electrons corresponding to an incident electron, the secondary-electron emitting surface comprising the alkali metal generated by a method according to claim 1.

15. An electron tube comprising a photo-cathode according to claim 13.

16. An electron tube according to claim 15, further comprising:

an electron multiplying part comprised of one or more dynodes each having a secondary-electron emitting surface for emitting secondary electrons in accordance incidence of the photoelectron emitted from the photo-cathode; and an anode collecting the secondary electrons outputted from the electron multiplying part and extracting the collected secondary electrons as an electric current to the outside.

17. An electron tube according to claim 15, further comprising:

an anode for collecting the photoelectron emitted from the photo-cathode and extracting the collected photoelectron as an electric current to the outside.

18. An electron tube according to claim 15, said electron tube comprising an image tube having at least a fluorescent screen for converting the photoelectron emitted from the photo-cathode, into light.

19. An electron tube according to claim 15, further comprising a streak tube comprising:

an accelerating electrode for accelerating the photoelectron emitted from the photo-cathode;

a focusing electrode for focusing the photoelectron accelerated by the accelerating electrode;

an anode having an aperture through which the photoelectron focused by the focusing electrode can pass;

a deflecting electrode having a pair of electrode plates opposed to each other and adapted to be able to sweep the photoelectron having passed through the aperture provided in the anode, in a predetermined direction by a predetermined deflection voltage applied between the pair of electrode plates; and a fluorescent screen for converting the photoelectron deflected by the deflecting electrode, into light.

20. An electron tube comprising an electron multiplying part comprised of one or more dynodes each having a secondary-electron emitting surface according to claim 14.

21. An electron tube according to claim 20, further comprising:

a photo-cathode for emitting a photoelectron corresponding to incident light toward the electron multiplying part; and an anode for collecting, secondary electrons emitted from the electron multiplying part and extracting the collected secondary electrons as an electric current to the outside.

22. A method according to claim 1, wherein the space, in which the alkali metal generating device is set, constitutes part of the inner space of the container.

* * * * *